(12) United States Patent
Kang

(10) Patent No.: US 7,768,313 B2
(45) Date of Patent: Aug. 3, 2010

(54) NONVOLATILE PROGRAMMABLE LOGIC CIRCUIT

(75) Inventor: Hee Bok Kang, Daejeon (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/198,823

(22) Filed: Aug. 26, 2008

(65) Prior Publication Data

US 2009/0058460 A1 Mar. 5, 2009

Related U.S. Application Data

(62) Division of application No. 10/737,758, filed on Dec. 18, 2003, now Pat. No. 7,428,160.

(30) Foreign Application Priority Data

Apr. 2, 2003 (KR) .................. 10-2003-0020767

(51) Int. Cl.
H03K 19/00 (2006.01)
H03K 19/20 (2006.01)
G11C 11/00 (2006.01)

(52) U.S. Cl. .................. 326/93; 327/202; 365/145; 365/154; 326/113

(58) Field of Classification Search .................. None
See application file for complete search history.

(56) References Cited

U.S. PATENT DOCUMENTS

| | | | | |
|---|---|---|---|---|
| 5,280,203 A * | 1/1994 | Hung et al. | .................. | 326/37 |
| 5,399,925 A | 3/1995 | Nguyen | | |
| 5,491,429 A | 2/1996 | Gasparik | | |
| 5,557,225 A * | 9/1996 | Denham et al. | .............. | 327/199 |
| 5,557,255 A * | 9/1996 | Adams et al. | ............ | 340/426.3 |
| 5,767,718 A * | 6/1998 | Shih | .................. | 327/228 |
| 6,067,244 A | 5/2000 | Ma et al. | | |
| 6,124,728 A | 9/2000 | Nishimura et al. | | |
| 6,150,838 A | 11/2000 | Wittig et al. | | |
| 6,157,979 A | 12/2000 | Barnett | | |
| 6,166,939 A | 12/2000 | Nataraj et al. | | |
| 6,191,607 B1 | 2/2001 | Meng et al. | | |
| 6,246,259 B1 | 6/2001 | Zaliznyak et al. | | |
| 6,272,594 B1 | 8/2001 | Gupta et al. | | |
| 6,301,145 B1 | 10/2001 | Nishihara | | |
| 6,314,016 B1 * | 11/2001 | Takasu | .................. | 365/145 |
| 6,363,439 B1 | 3/2002 | Battles et al. | | |
| 6,707,702 B1 | 3/2004 | Komatsuzaki | | |
| 6,747,885 B2 | 6/2004 | Park | | |
| 6,768,338 B1 | 7/2004 | Young et al. | | |
| 6,804,133 B1 | 10/2004 | Khanna | | |
| 6,822,886 B2 | 11/2004 | Regev | | |
| 6,882,568 B2 | 4/2005 | Shiota et al. | | |

(Continued)

FOREIGN PATENT DOCUMENTS

KR   10-19990049972   6/2001

*Primary Examiner*—Rexford N Barnie
*Assistant Examiner*—Dylan White
(74) *Attorney, Agent, or Firm*—Townsend and Townsend and Crew LLP

(57) ABSTRACT

A nonvolatile programmable logic circuit using a ferroelectric memory performs a nonvolatile memory function and an operation function without additional memory devices, thereby reducing power consumption. Also, a nonvolatile ferroelectric memory is applied to a FPGA (Field Programmable Gate Array), thereby preventing leakage of internal data and reducing the area of a chip.

3 Claims, 28 Drawing Sheets

U.S. PATENT DOCUMENTS

| | | |
|---|---|---|
| 6,924,663 B2 | 8/2005 | Masui et al. |
| 6,956,399 B1 | 10/2005 | Bauer |
| 6,975,152 B1 * | 12/2005 | Lapidus .................. 327/202 |
| 6,992,503 B2 | 1/2006 | Madurawe |
| 7,038,929 B2 | 5/2006 | Kang |
| 7,050,323 B2 | 5/2006 | Takahashi et al. |
| 7,116,131 B1 | 10/2006 | Chirania et al. |
| 7,130,211 B2 | 10/2006 | Kang |
| 7,190,606 B2 | 3/2007 | Kang |
| 7,231,472 B2 | 6/2007 | Kang |
| 7,333,376 B2 | 2/2008 | Kang |
| 7,333,377 B2 | 2/2008 | Kang |
| 7,424,559 B2 | 9/2008 | Kang |
| 7,450,457 B2 | 11/2008 | Shiota et al. |
| 7,583,121 B2 * | 9/2009 | Berzins et al. ............ 327/202 |
| 2002/0180503 A1 * | 12/2002 | Lu ........................ 327/203 |
| 2003/0012063 A1 | 1/2003 | Chien |
| 2003/0137890 A1 | 7/2003 | Vlaskenko et al. |
| 2004/0120187 A1 * | 6/2004 | Kang .................. 365/185.04 |
| 2005/0218952 A1 * | 10/2005 | Padhye et al. ............ 327/218 |
| 2006/0053246 A1 | 3/2006 | Lee |
| 2006/0139054 A1 | 6/2006 | Madurawe |
| 2006/0158941 A1 | 7/2006 | Kang |
| 2007/0176633 A1 | 8/2007 | Kawabe |
| 2007/0263424 A1 * | 11/2007 | Kang ........................ 365/145 |
| 2008/0068041 A1 | 3/2008 | Madurawe |
| 2008/0183950 A1 | 7/2008 | Roohparvar |
| 2009/0091965 A1 | 4/2009 | Kang |
| 2009/0091966 A1 | 4/2009 | Kang |
| 2009/0091967 A1 | 4/2009 | Kang |
| 2009/0094434 A1 | 4/2009 | Kang |
| 2009/0115481 A1 * | 5/2009 | Kim .......................... 327/198 |

* cited by examiner

NONVOLATILE PROGRAMMABLE LOGIC CIRCUIT

CROSS-REFERENCES TO RELATED APPLICATIONS

The present application is a division of U.S. patent application Ser. No. 10/737,758, filed on Dec. 18, 2003, which claims priority to Korean patent application number 10-2003-0020767, filed on Apr. 2, 2003 and Korean patent application number 10-1999-0049972 (now U.S. Pat. No. 6,363,004), granted filing date Mar. 26, 2002, which is incorporated by reference in its entirety.

BACKGROUND OF THE INVENTION

1. Field of the Invention

The present invention generally relates to a program register using a nonvolatile memory device and a programmable logic circuit using the same, and more specifically, to a technology for storing data or performing an operation on the data without additional memory devices, thereby reducing the area of the circuit.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 1999-49972 by the same inventor of the present invention. Therefore, the basic structure and the operation on the FRAM are not described herein.

A conventional programmable logic operation circuit for changing logic levels of input signals stores address information in storage means. However, since a SRAM (Static Random Access Memory) is used as the conventional programmable logic operation circuit, various information stored in latches is leaked in a power-off mode. Even when power is supplied to the system again, various data for operations of circuits are required to be reset.

SUMMARY OF THE INVENTION

Accordingly, it is an object of the present invention to provide a nonvolatile programmable logic circuit using a ferroelectric memory which disconnects power supply during a stand-by mode of the system to reduce power consumption.

It is another object of the present invention to provide a nonvolatile programmable logic circuit using a ferroelectric memory for storing data and performing an operation on the data without additional memory devices.

It is still another object of the present invention to provide a nonvolatile programmable logic circuit using a ferroelectric memory applied to a FPGA (Field Programmable Gate Array) to reduce the area of a chip.

In an embodiment, a nonvolatile programmable logic circuit comprises a plurality of CAMs (Content Addressable Memory), a first nonvolatile ferroelectric register and a switch means. The plurality of CAMs, connected in parallel to a match line, change a voltage level of a match line. The first nonvolatile ferroelectric register generates a first logic control signal depending on a programmed code in the nonvolatile ferroelectric capacitor. The switch means precharges the match line to a predetermined level in response to the first logic control signal.

In an embodiment, a nonvolatile programmable logic circuit comprises an inversion means, a nonvolatile ferroelectric register and an output control means. The inversion means selectively outputs one of a power voltage and a ground voltage in response to an input signal. The nonvolatile ferroelectric register generates a pair of logic control signals having an opposite phase from each other depending on a programmed code in a nonvolatile ferroelectric capacitor. The output control means outputs a signal outputted from the inversion means or floats an output terminal in response to the pair of logic control signals.

In an embodiment, a nonvolatile programmable logic circuit comprises a nonvolatile ferroelectric register, a logic combination means and an inversion means. The nonvolatile ferroelectric register generates a pair of logic control signals of opposite phases depending on a programmed code in a nonvolatile ferroelectric capacitor. The logic combination means logically combines the pair of logic control signals and the input signal. The inversion means outputs one of a power voltage and a ground voltage or floats an output terminal in response to an output signal from the logic combination means.

In an embodiment, a nonvolatile programmable logic circuit comprises a nonvolatile ferroelectric register and an inversion means. The nonvolatile ferroelectric register stores an input signal in a nonvolatile ferroelectric capacitor. The inversion means outputs one of a power voltage and a ground voltage or floats an output terminal in response to an output signal from the nonvolatile ferroelectric register.

In an embodiment, a nonvolatile programmable logic circuit comprises a nonvolatile ferroelectric register and a switch means. The nonvolatile ferroelectric register generates a logic control signal depending on a programmed code in a nonvolatile ferroelectric register. The switch means selectively connects an output terminal to a source in response to the logic control signal.

In an embodiment, a nonvolatile programmable logic circuit comprises a look-up table, a second nonvolatile ferroelectric register and a first transmission means. The look-up table selectively outputs first logic control signals outputted from a plurality of first nonvolatile ferroelectric registers in response to a logic input signal. The second nonvolatile ferroelectric register outputs a second logic control signal depending on a programmed code in a nonvolatile ferroelectric capacitor. The first transmission means selectively transmits an output signal from the look-up table in response to the second logic control signal.

In an embodiment, a nonvolatile programmable logic circuit comprises a latch means, a first nonvolatile ferroelectric register and a second nonvolatile ferroelectric register. The latch means selectively latches input data in response to a clock signal. The first nonvolatile ferroelectric register generates a first logic control signal to selectively transmit the clock signal depending on a programmed code in a nonvolatile ferroelectric capacitor. The second nonvolatile ferroelectric register generates a second logic control signal to reset the latch means depending on a programmed code in a nonvolatile ferroelectric capacitor.

In an embodiment, a nonvolatile programmable logic circuit comprises a flip-flop, a first nonvolatile ferroelectric register and a second nonvolatile ferroelectric register. The flip-flop selectively stores input data in response to a clock signal.

The first nonvolatile ferroelectric register generates a first logic control signal to selectively transmit the clock signal depending on a programmed code in a nonvolatile ferroelectric capacitor. The second nonvolatile ferroelectric register generates a second logic control signal to reset the flip-flop depending on a programmed code in a nonvolatile ferroelectric capacitor.

In an embodiment, a nonvolatile programmable logic circuit comprises a program command processing block, a program register control block and a program register array block. The program command processing block sequentially outputs a plurality of command signals to code program commands in response to a write enable signal, a chip enable signal, an output enable signal and a reset signal. The program register control block outputs a write control signal and a cell plate signal using the plurality of command signals and a power-up detecting signal. The program register array block, including a plurality of nonvolatile ferroelectric registers each comprising a nonvolatile ferroelectric capacitor, programs the nonvolatile ferroelectric capacitor in response to the write control signal and the cell plate signal.

DETAILED DESCRIPTION OF THE PREFERRED EMBODIMENTS

The present invention will be described in detail with reference to the accompanying drawings.

A nonvolatile ferroelectric programmable logic circuit according to an embodiment of the present invention can be applied to various logic circuits such as a CAM (Content Addressable Memory), a CAM array, a buffer, a buffer array, an inversion means, a switch, a transmission switch, a pull-up/pull-down switch, a look-up table, a latch and a flip-flop.

Figure 1:
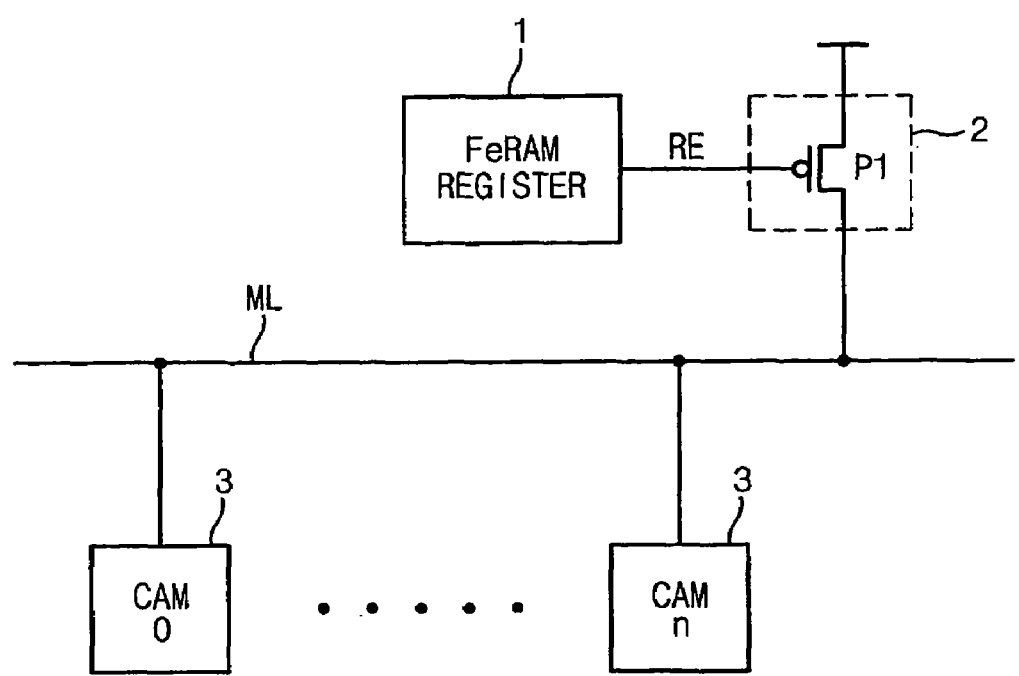
FIG. 1 is a block diagram illustrating a FeRAM register applied to a pull-up operation of a match line connected to a plurality of CAMs according to an embodiment of the present invention.

FIG. 1 is a block diagram illustrating a FeRAM register 1 applied to a pull-up operation of a match line connected to a plurality of CAMs according to an embodiment of the present invention.

In an embodiment, the nonvolatile programmable logic circuit comprises a FeRAM register 1, a pull-up switch 2 and a plurality of CAMs 3.

The plurality of CAMs 3 each connected to match lines ML constitute an array.

The FeRAM register 1 outputs a control signal RE to selectively control a switching operation of the pull-up switch 2.

The pull-up switch 2 comprises a PMOS transistor P1. The PMOS transistor P1, connected between a power voltage and a match line ML, has a gate to receive the control signal RE. The PMOS transistor P1 selectively precharges the match line ML in response to the control signal RE.

Hereinafter, the operation of FIG. 1 is described.

In an initial mode, the match line ML is precharged to a power voltage by the pull-up switch 2. Then, when an output signal from one of the plurality of CAMs 3 becomes at a low level, a voltage level of the match line ML transits from a high to low level.

Figure 2:
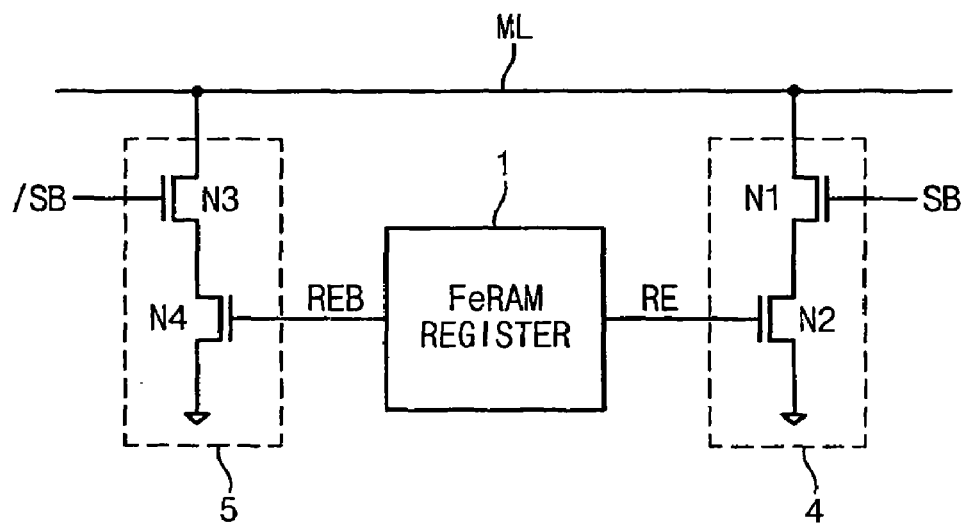
FIG. 2 is a block diagram illustrating a CAM having an NMOS transistor structure using a FeRAM register of FIG. 1.

FIG. 2 is a block diagram illustrating a CAM having an NMOS transistor structure using a FeRAM register according to an embodiment of the present invention.

In an embodiment, the CAM comprises a FeRAM register 1 and a pair of switching units 4 and 5.

The FeRAM register 1 outputs control signals RE and REB for disabling the voltage level of the match line ML from a high to low level.

The first switching unit 4 comprises NMOS transistors N1 and N2 connected serially between the match line ML and the ground voltage. The NMOS transistor N1 has a gate to receives a line control signal SB applied from a search bus. The NMOS transistor N2 has a gate to receive the control signal RE applied from the FeRAM register 1.

The second switching unit 5 comprises NMOS transistors N3 and N4. The NMOS transistor N3 has a gate to receive a line control signal /SB applied from the search bus. The NMOS transistor N4 has a gate to receive the logic control signal REB applied from the FeRAM register 1.

If the line control signal SB and the logic control signal RE are at a high level or the line control signal /SB and the logic control signal REB are at a high level, the voltage level of the match line ML transits to the ground voltage.

Hereinafter, the operation of FIG. 2 is described.

If the line control signal /SB and the logic control signal REB are enabled to a high level simultaneously, the NMOS transistors N3 and N4 are all turned on to connect the match line ML to the ground voltage. IF the line control signal SB and the logic control signal RE are enabled to a high level simultaneously, the NMOS transistors N1 and N2 are all turned on to connected to the match line ML to the ground voltage. As a result, the voltage level of the match line ML transits from a high to low level.

However, when the line control signal /SB has an opposite phase to the logic control signal REB, the match line ML is maintained at a high level. When the line control signal SB has an opposite phase to the logic control signal RE, the match line ML is maintained at a high level like in a precharge mode.

Figure 3:
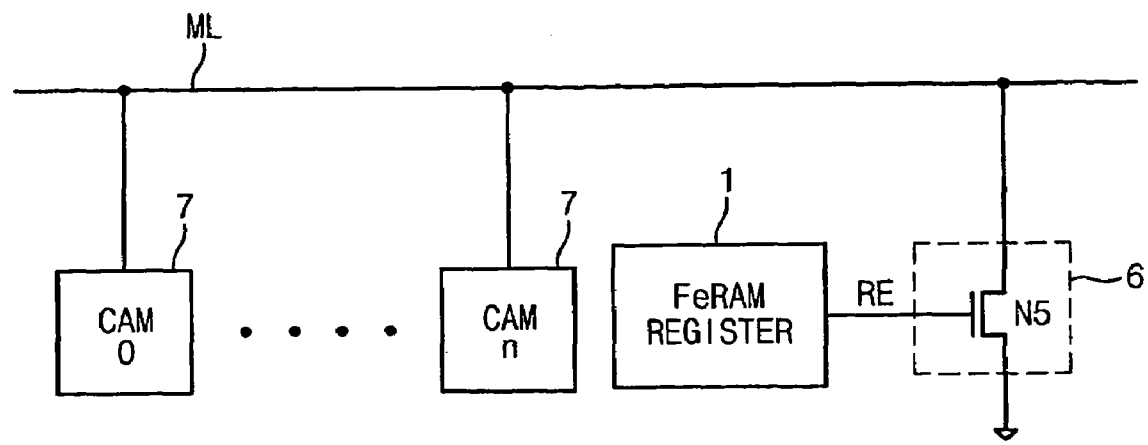
FIG. 3 is a block diagram illustrating a FeRAM register applied to a pull-down operation of a match line connected to a plurality of CAMs according to an embodiment of the present invention.

FIG. 3 is a block diagram illustrating a FeRAM register 1 applied to a pull-down operation of a match line connected to a plurality of CAMs according to an embodiment of the present invention.

In an embodiment, the nonvolatile programmable logic circuit comprises a FeRAM register 1, a pull-down switch 6 and a plurality of CAMs 7.

The plurality of CAMs 7 each connected to match lines ML constitute an array.

The FeRAM register 1 outputs a control signal RE to selectively control a switching operation of the pull-down switch 6.

The pull-down switch 6 comprises an NMOS transistor N5. The NMOS transistor N5, connected to the match line ML and a ground voltage, has a gate to receive the control signal RE. The NMOS transistor N5 selectively pulls down the match line ML in response to the control signal RE.

Hereinafter, the operation of FIG. 3 is described.

In an initial state, the match line ML is pulled down to the ground voltage by the pull-down switch 6. When an output signal from one of the plurality of CAMs 7 is at a high level, a voltage level of the match line ML transits from a low to high level.

Figure 4:
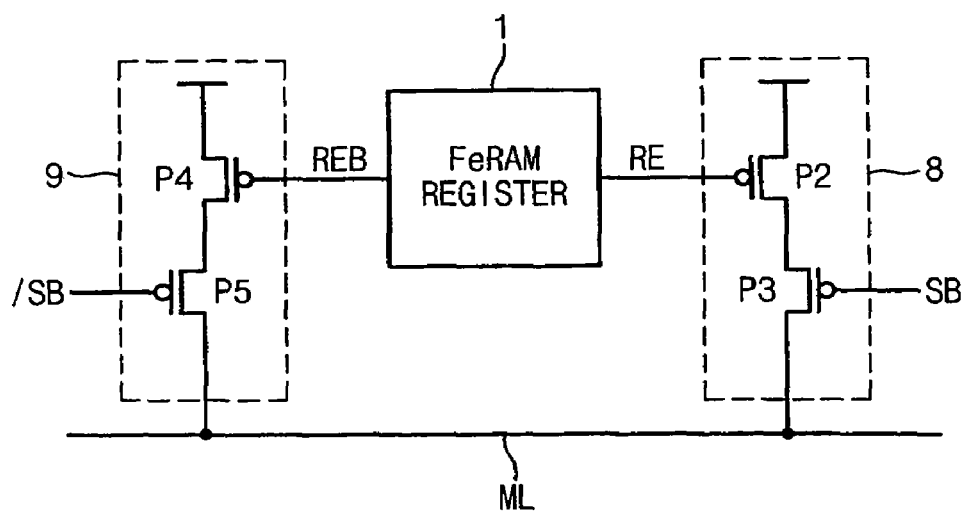
FIG. 4 is a block diagram illustrating a CAM having a PMOS transistor structure using a FeRAM register of FIG. 3.

FIG. 4 is a block diagram illustrating a CAM having a PMOS transistor structure using a FeRAM register according to an embodiment of the present invention.

In an embodiment, the nonvolatile programmable logic circuit comprises a FeRAM register 1 and a pair of switching units 8 and 9.

The FeRAM register 1 outputs control signals RE and REB for enabling a voltage level of the match line ML from a low to a high level.

The first switching unit 8 comprises PMOS transistor P2 and P3 connected in series between a power voltage terminal and the match line ML. The PMOS transistor P2 has a gate to receive the logic control signal RE applied from the FeRAM register 1. The PMOS transistor P3 has a gate to receive a line control signal SB applied from a search bus.

The second switching unit 9 comprises PMOS transistors P4 and P5 connected serially between the power voltage terminal and the match line ML. The PMOS transistor P4 has a gate to receive the logic control signal REB applied from the FeRAM register 1. The PMOS transistor P5 has a gate to receive a line control signal /SB applied from the search bus.

As a result, when the line control signal SB and the logic control signal RE are at a low level or the line control signal /SB and the logic control signal REB are at a low level, the voltage level of the match line ML transits to a power voltage.

Hereinafter, the operation of FIG. 4 is described.

If the line control signal /SB and the logic control signal REB are disabled to a low level simultaneously, the PMOS transistors P4 and P5 are all turned on to connect the match line to the power voltage. When the line control signal SB and the logic control signal RE are disabled to a low level simultaneously, the PMOS transistor P2 and P3 are all turned on to connect the match line ML to the power voltage. As a result, the voltage level of the match line ML transits from a low to high level.

When the line control signal /SB has an opposite phase to the logic control signal REB, the match line ML is maintained at a low level. When the line control signal SB has an opposite phase to the logic control signal RE, the match line ML is maintained at a low level in the precharge mode.

Figure 5:
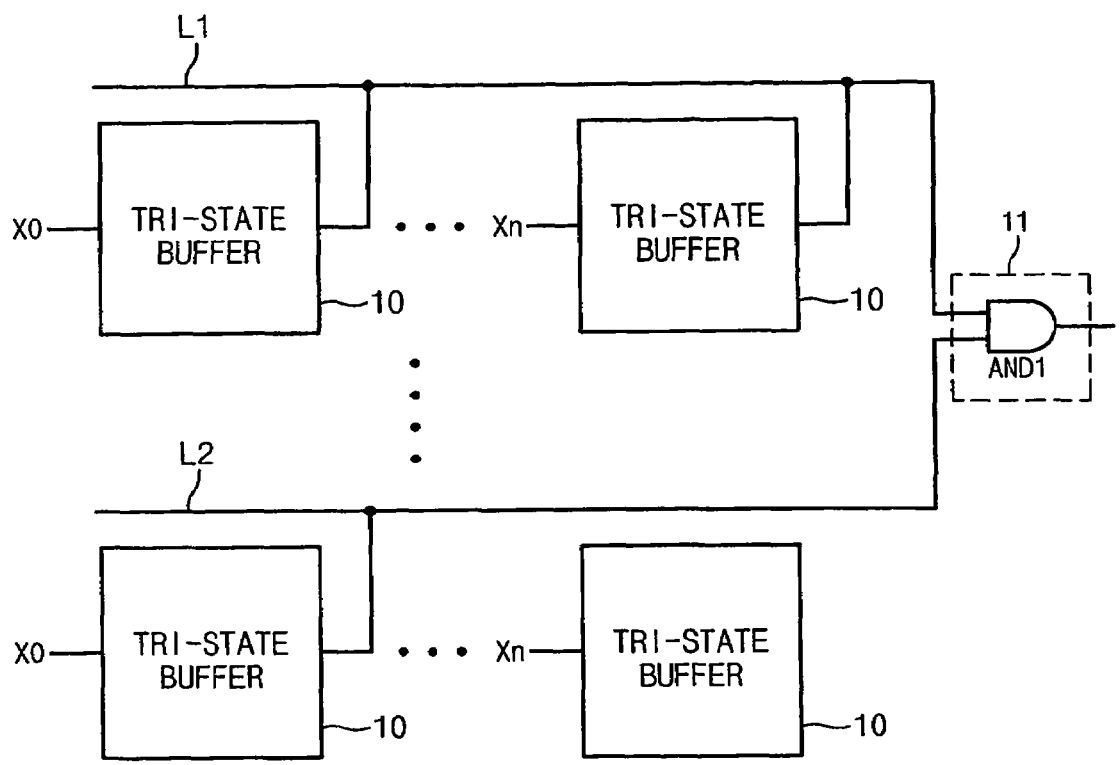
FIG. 5 is a block diagram illustrating a nonvolatile programmable logic circuit comprising a tri-state buffer using a FeRAM register.

FIG. 5 is a block diagram illustrating a nonvolatile programmable logic circuit comprising a tri-state buffer 10 using a FeRAM register 1.

In an embodiment, the nonvolatile programmable logic circuit comprises a plurality of tri-state buffers 10 and a logic operation unit 11.

The plurality of tri-state buffers 10 are connected to a first output line L1 and a second output line L2, respectively.

An output signal Yi selected out of output signals Y0~Yn from the plurality of tri-buffers 10 connected to the first output line L1 is outputted into the first output line L1. An output signal Yi selected out of output signals Y0~Yn from the plurality of tri-buffers 10 connected to the second output line L2 is outputted into the second output line L2.

The logic operation unit 11 comprises an AND gate AND1 for performing an AND operation on the output signals Yi applied from the first output line L1 and the second output line L2.

Figure 6:
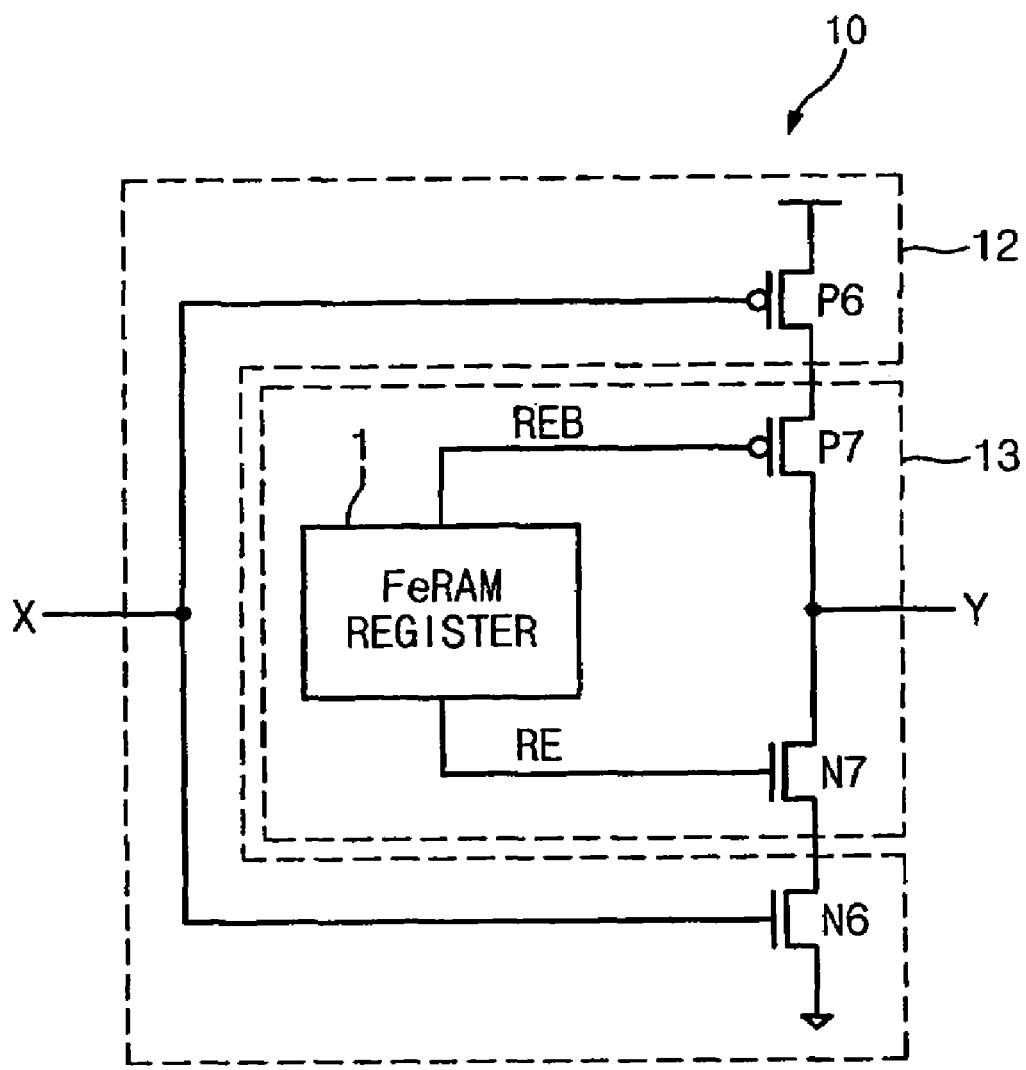
FIGS. 6 to 9 are circuit diagrams illustrating an example of the tri-state buffer of FIG. 5.

FIG. 6 is a circuit diagram illustrating an example of the tri-state buffer of FIG. 5.

The tri-state buffer 10 comprises an inverter unit 12 and an output controller 13.

The inverter unit 12 comprises a PMOS transistor P6 and an NMOS transistor N6. The PMOS transistor P6, connected between the power voltage and the output controller 13, has a gate to receive an input signal X. The NMOS transistor N6, connected between the output controller 13 and the ground voltage, has a gate to receive the input signal X.

The output controller 13 comprises the FeRAM register 1 and an output driving unit comprising a PMOS transistor P7 and an NMOS transistor N7. The FeRAM register 1 outputs the control signal RE and REB having an opposite state from each other to control inversion of the buffer. The PMOS transistor P7 and the NMOS transistor N7 are connected in series between the PMOS transistor P6 and the NMOS transistor N6. The PMOS transistor P7 has a gate to the logic control signal REB, and the NMOS transistor N7 has a gate to the logic control signal RE. An output signal Y is outputted from a common terminal of the PMOS transistor P7 and the NMOS transistor N6.

Hereinafter, the operation of FIG. 6 is described.

When the control signal RE is at a high level and the logic control signal REB is at a low level, the NMOS transistor N7 and the PMOS transistor P7 are all turned on. As a result, an input signal X is inverted to have an opposite phase to an output signal Y.

On the other hand, when the control signal RE is at a low level and the logic control signal REB is at a high level, the NMOS transistor N7 and the PMOS transistor P7 are all turned off. As a result, a voltage level of the output signal Y is at a floating state regardless of that of the input signal X.

Figure 7:
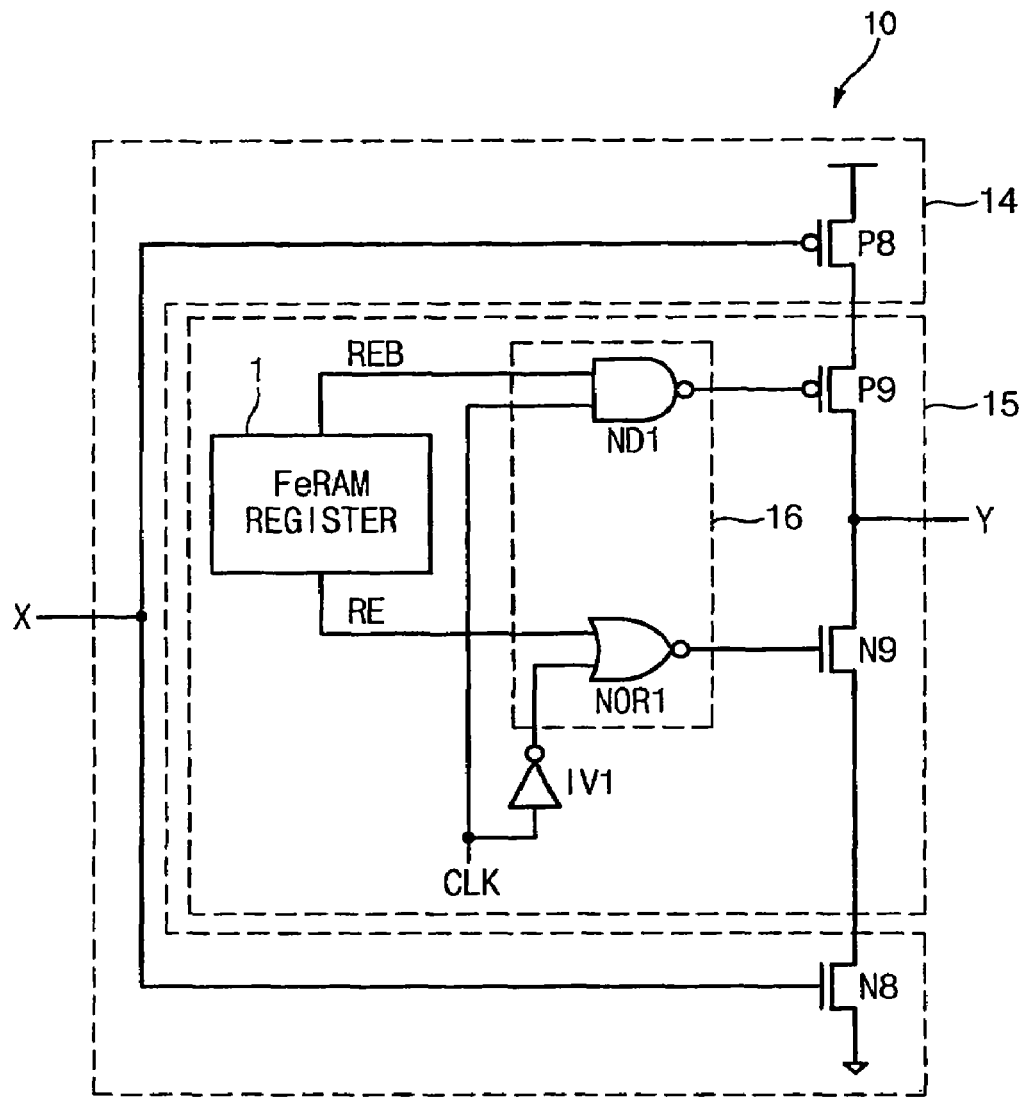

FIG. 7 is a circuit diagram of another example of the tri-state buffer 10 of FIG. 5.

The tri-state buffer 10 comprises an inverter unit 14 and an output controller 15.

The inverter unit 14 comprises a PMOS transistor P8 and an NMOS transistor N8. The PMOS transistor P8, connected between a power voltage and the output controller 15, has a gate to receive the input signal X. The NMOS transistor N8, connected between the output controller 15 and the ground voltage, has a gate to receive the input signal X.

The output controller 15 comprises the FeRAM register 1, an inverter IV1 and a logic operation unit 16. The FeRAM register 1 outputs the control signals RE and REB having an opposite phase from each other. The inverter IV1 inverts a clock signal CLK.

The logic operation unit 16 comprises an NAND gate ND1 and an NOR gate NOR1. The NAND gate ND1 performs an NAND operation on the logic control signal REB and the clock signal CLK. The NOR gate NOR1 performs an NOR operation on the logic control signal RE and an output signal from the inverter IV1.

The PMOS transistor P9 and the NMOS transistor N9 are connected in series between the PMOS transistor P8 and the NMOS transistor N8. The PMOS transistor P9 has a gate to receive an output signal from the NAND gate ND1. The NMOS transistor N9 has a gate to receive an output signal from the NOR gate NOR1. The output signal Y is outputted from a common terminal of the PMOS transistor P9 and the NMOS transistor N9.

Hereinafter, the operation of FIG. 7 is described.

When the logic control signal RE is at a low level, the logic control signal REB at a high level and the clock signal CLK at a low level, the NMOS transistor N9 and the PMOS transistor P9 are all turned off. As a result, the voltage level of the output signal Y is at a floating state.

When the logic control signal RE is at the low level, the logic control signal REB at the high level and the clock signal CLK at a high level, the NMOS transistor N9 and the PMOS transistor P9 are all turned on. As a result, the input signal X is inverted to have an opposite phase to that of the output signal Y.

The voltage level of the output signal Y can be periodically controlled by inverting or floating the voltage level of the input signal X in response to the clock signal CLK.

If the logic control signal RE is at a high level and the logic control signal REB is at a low level, the NMOS transistor N9 and the PMOS transistor P9 are all turned off regardless of the clock signal CLK. As a result, the voltage level of the output signal Y becomes floated.

Figure 8:
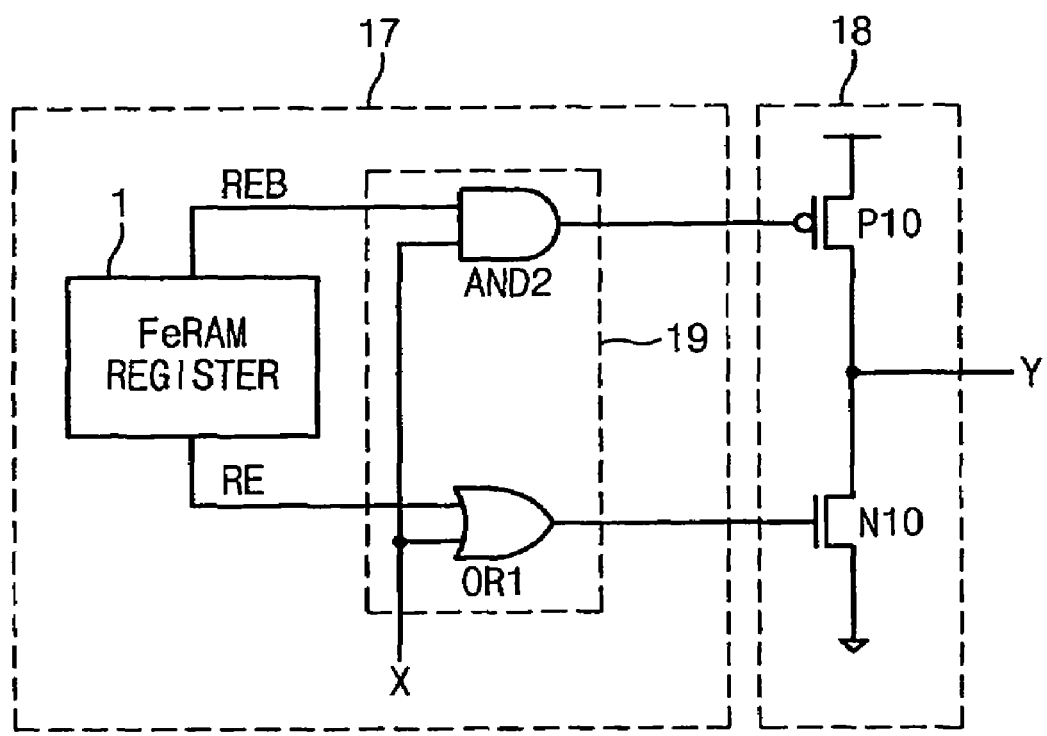

FIG. 8 is a circuit diagram of still another diagram of the tri-state buffer 10 of FIG. 5.

The tri-state buffer 10 comprises an input controller 17 and an output driving unit 18.

The input controller 17 comprises the FeRAM register 1 and a logic operation unit 19. The FeRAM register 1 outputs the logic control signals RE and REB having an opposite phase from each other for inversion of an inverter. The logic operation unit 19 comprises an AND gate AND2 and an OR gate OR1. The AND gate AND2 performs an AND operation on the logic control signal REB and the input signal X. The OR gate OR1 performs an OR operation on the logic control signal RE and the input signal X.

The output driving unit 18 comprises a PMOS transistor 10 and an NMOS transistor 10. The PMOS transistor P10 and the NMOS transistor N10 are connected serially between the power voltage and the ground voltage. The PMOS transistor P10 has a gate to receive an output signal from the AND gate AND2. The NMOS transistor N10 has a gate to receive an output signal from the OR gate OR1.

Hereinafter, the operation of FIG. 8 is described.

When the logic control signal RE is at the high level and the logic control signal REB is at the low level, the voltage level of the output signal Y is floated regardless of that of the input signal X.

If the logic control signal RE is at the low level, the logic control signal REB at the low level and the input signal X at a high level, the NMOS transistor N10 is turned on. AS a result, the input signal X is inverted, and the output signal Y transits to a low level.

On the other hand, when the logic control signal RE is at the low level, the logic control signal REB at the high level and the input signal X at a low level, the PMOS transistor P10 is turned on. As a result, the input signal X is inverted, and the output signal Y transits to a high level.

Figure 9:
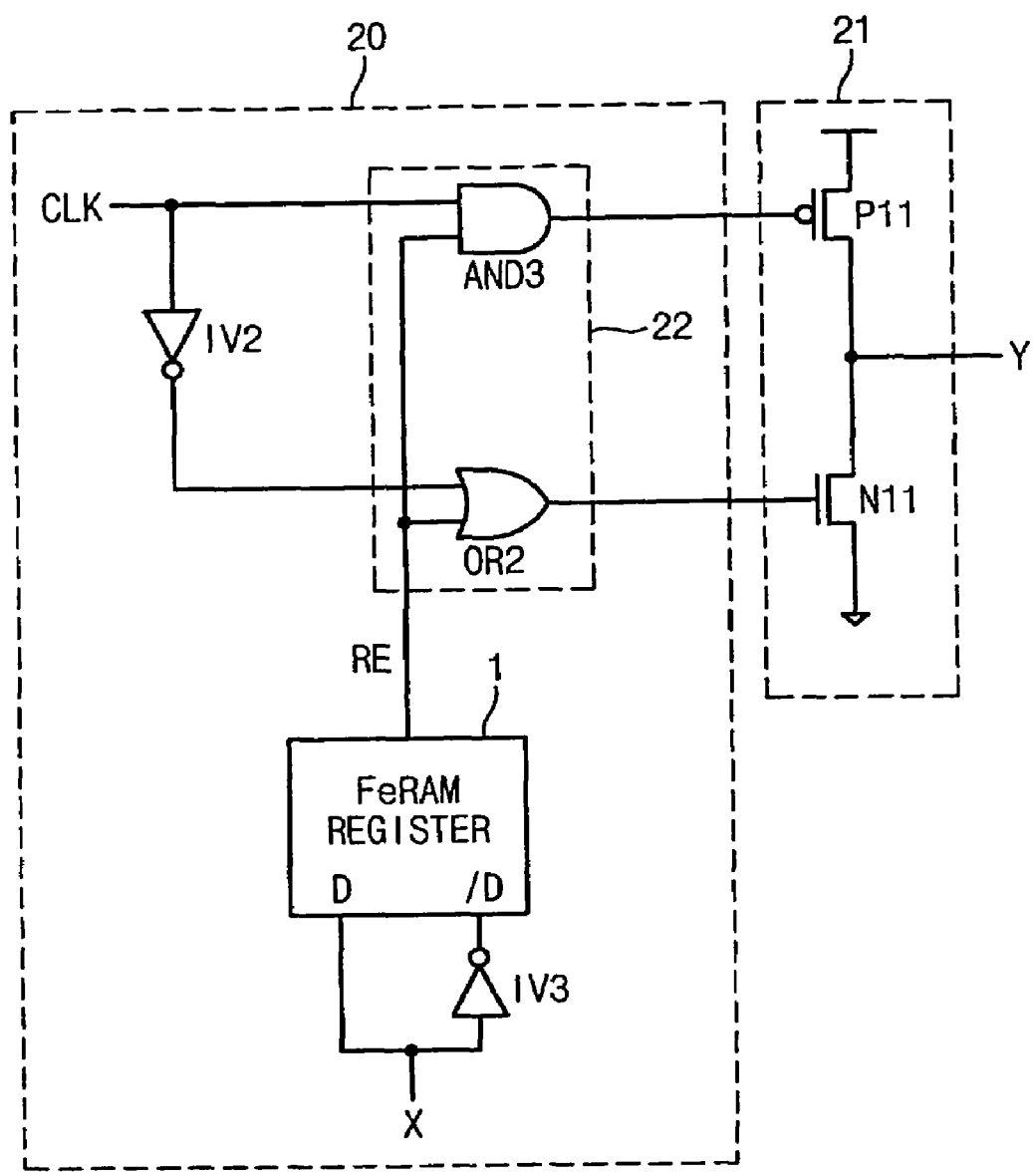

FIG. 9 is a circuit diagram of still another example of the tri-state buffer 10 of FIG. 5 for controlling logic of the inverter unit and storing values of input signals at the same time.

The tri-state buffer 10 of FIG. 9 comprises an input controller 20 and an output driving unit 21.

The input controller 20 comprises inverters IV2 and IV3, the FeRAM register 1 and a logic operation unit 22. The inverter IV2 inverts the clock signal CLK, and the inverter IV 3 inverts the input signal X. The FeRAM register 1 outputs the logic control signal RE for controlling the logic level of the output driving unit 21.

The logic operation unit 22 comprises an AND gate AND3 and an OR gate OR2. The AND gate AND3 performs an AND operation on the clock signal CLK and the logic control signal RE. The OR gate OR2 performs an OR operation on an output signal from the inverter IV2 and the logic control signal RE.

The output driving unit 21 comprises a PMOS transistor P11 and an NMOS transistor N11. The PMOS transistor P11 and the NMOS transistor N11 are connected in series between the power voltage and the ground voltage. The PMOS transistor P11 has a gate to receive an output signal from the AND gate AND3. The NMOS transistor N11 has a gate to receive an output signal from the OR gate OR2.

Hereinafter, the operation of FIG. 9 is described.

When the clock signal CLK is at the high level and the logic control signal RE is at the high level, the NMOS transistor N11 is turned on. As a result, the input signal X is inverted, and the output signal Y transits to a low level.

If the clock signal CLK is at the low level, the PMOS transistor P11 and the NMOS transistor N11 are turned on regardless of the logic control signal RE. As a result, the voltage level of the output signal Y is floated.

On the other hand, if the clock signal CLK is at the high level and the logic control signal RE is at the low level, the PMOS transistor P11 is turned on. As a result, the input signal X is inverted, and the output signal Y transits to a high level.

Figure 10:
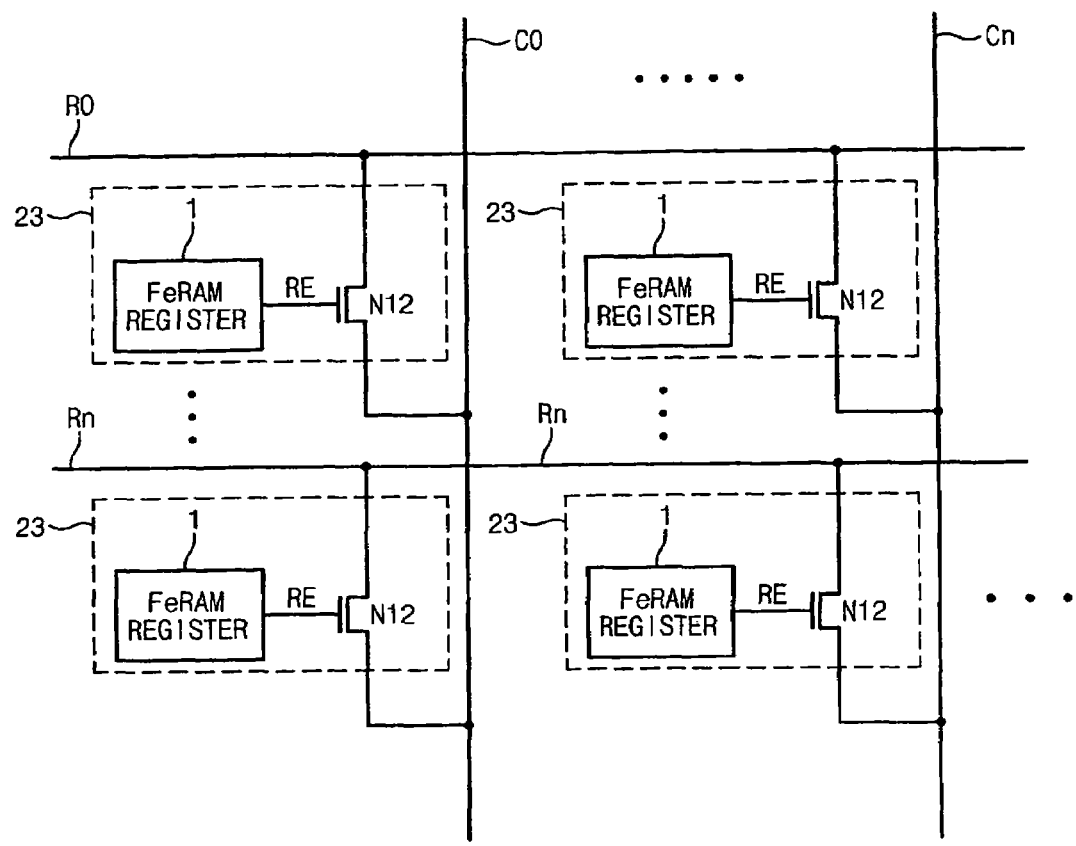
FIG. 10 is a block diagram illustrating a transmission switch for transmitting data between bus lines using a FeRAM register.

FIG. 10 is a block diagram illustrating a transmission switch 23 for transmitting data between bus lines using a FeRAM register.

In an embodiment, a plurality of transmission switches 23 are connected between a plurality of row bus lines R0~Rn and a plurality of column bus lines C0~Cn crossed from each other.

Each transmission switch 23 comprises the FeRAM register 1 and an NMOS transistor N12. The FeRAM register 1 outputs the control signal RE for controlling the switching operation. The NMOS transistor N12, connected between the row bus line R and the column bus line C, has a gate to receive the logic control signal RE.

When the control signal RE is at the high level, the NMOS transistor N12 is turned on to connect the row bus line R to the column bus line C. However, when the logic control signal RE is at the low level, the NMOS transistor N12 is turned off to disconnect the row bus line R to the column bus line C.

Figure 11:
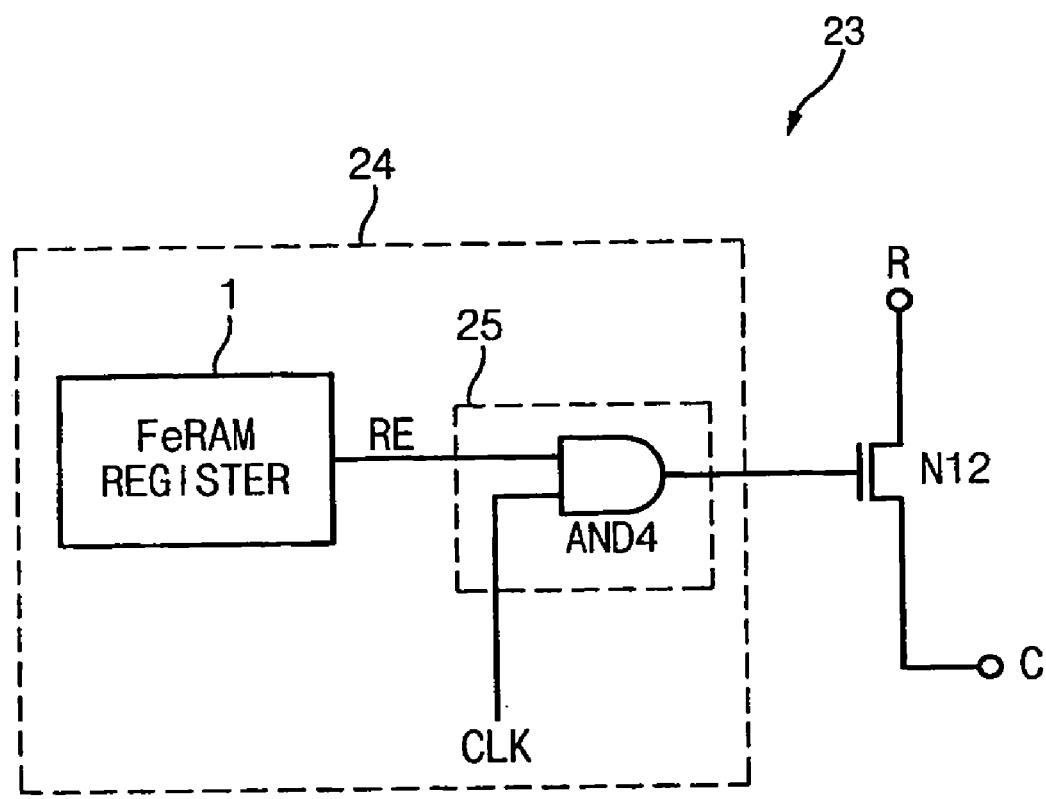
FIG. 11 is a circuit diagram illustrating another example of the transmission switch of FIG. 10.

FIG. 11 is a circuit diagram illustrating another example of the transmission switch 23 of FIG. 10.

The transmission switch 23 of FIG. 11 comprises a switch controller 24 and the NMOS transistor N12.

The switch controller 24 comprises the FeRAM register 1 and a logic operation unit 25. The FeRAM register 1 outputs the control signal RE for controlling the switching operation. The logic operation unit 25 comprises an AND gate AND4 for performing an AND operation on the control signal RE and the clock signal CLK.

Hereinafter, the operation of FIG. 11 is described.

If the clock signal CLK and the logic control signal RE are at the high level, the NMOS transistor N12 is turned on to connect the row bus line R to the column bus line C.

However, when the clock signal CLK is at the low level and the logic control signal RE is at the high level, the NMOS transistor N12 is turned off to disconnect the row bus line R to the column bus line C.

If the control signal RE is at the low level, the NMOS transistor is turned off regardless of the clock signal CLK.

Figure 12:
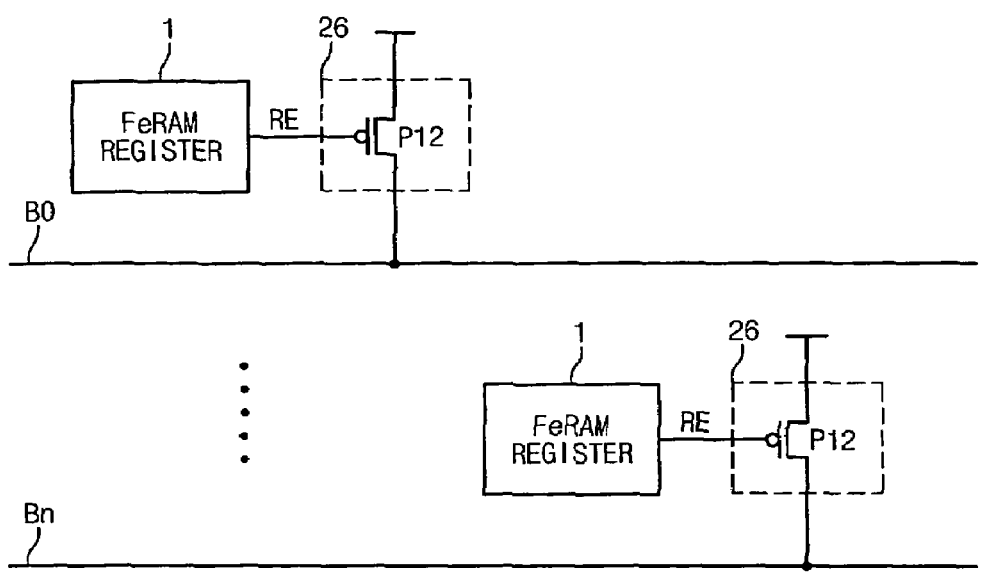
FIG. 12 is a block diagram illustrating the nonvolatile programmable logic circuit for selectively pulling up bus lines using a FeRAM register.

FIG. 12 is a block diagram illustrating the nonvolatile programmable logic circuit for selectively pulling up bus lines using a FeRAM register 1.

The nonvolatile programmable logic circuit of FIG. 12 comprises a plurality of FeRAM registers 1 and a plurality of pull-up switches 26. Each FeRAM register 1 outputs the control signal RE for controlling each pull-up switch 26. The plurality of pull-up switches 26 are connected between the power voltage and a plurality of bus lines B0~Bn. Each pull-up switch 26 comprises a PMOS transistor P12 having a gate to receive the control signal RE.

When the control signal RE is at the low level, the pull-up switch 26 is turned on to pull up the bus line B to the power voltage. However, when the control signal RE is at the high level, the pull-up switch 26 is turned off.

Figure 13:
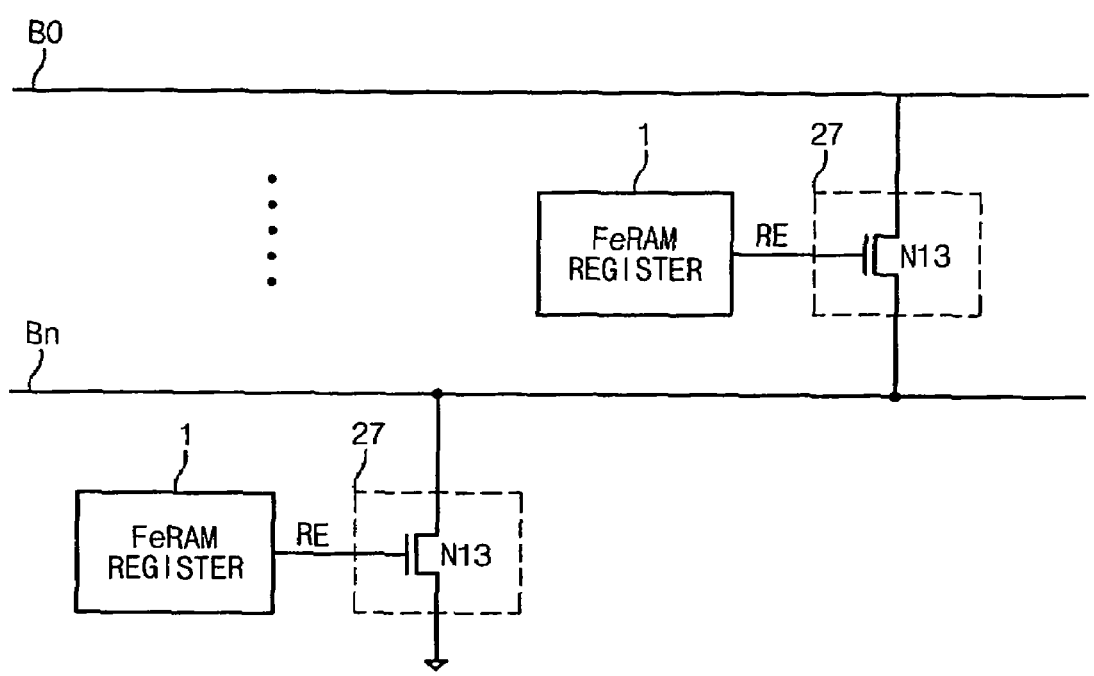
FIG. 13 is a block diagram illustrating the nonvolatile programmable logic circuit for selectively pulling down bus lines using a FeRAM register.

FIG. 13 is a block diagram illustrating the nonvolatile programmable logic circuit for selectively pulling down bus lines using a FeRAM register 1.

The nonvolatile programmable logic circuit of FIG. 13 comprises a plurality of FeRAM registers 1 and a plurality of pull-down switches 27. Each FeRAM register 1 outputs the control signal RE for controlling each pull-down switch 27. The plurality of pull-down switches 27 are connected between the plurality of bus lines B0~Bn and the ground voltage. Each pull-down switch 27 comprises an NMOS transistor N13 having a gate to receive the control signal RE.

When the control signal RE is at the high level, the pull-down switch 27 is turned on to pull down the bus line B to the ground voltage. However, when the control signal RE is at the low level, the pull-down switch 27 is turned off.

Figure 14:
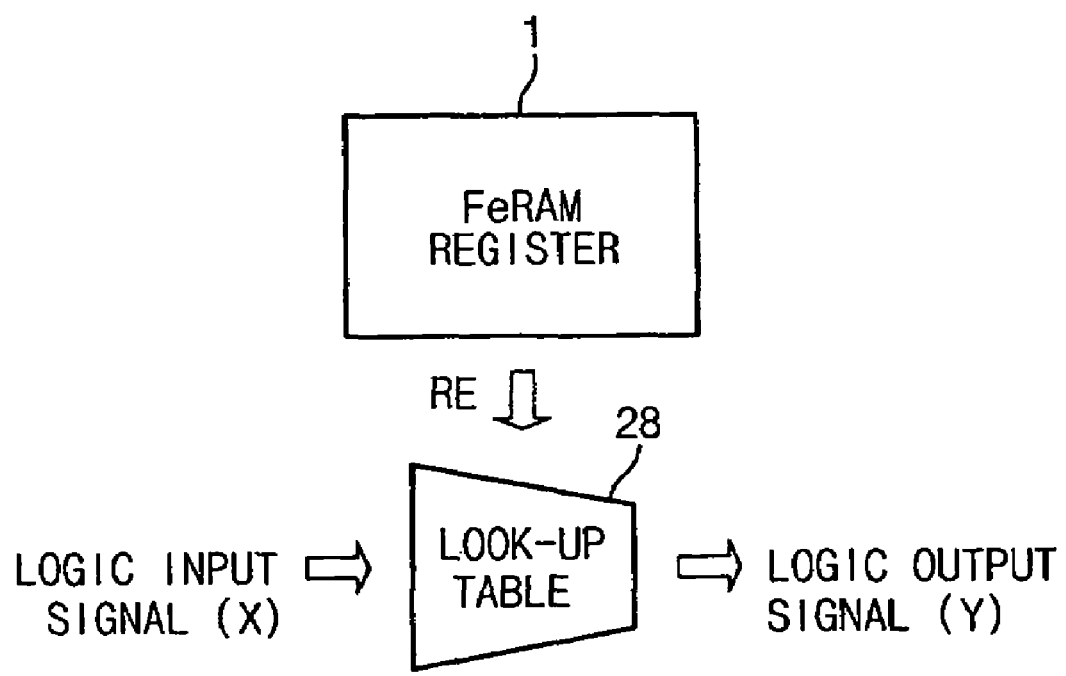
FIG. 14 is a block diagram illustrating the nonvolatile programmable logic circuit for controlling logic levels of a look-up table using a FeRAM register.

FIG. 14 is a block diagram illustrating the nonvolatile programmable logic circuit for controlling logic levels of a look-up table using a FeRAM register 1.

The FeRAM register 1 outputs the control signal RE for controlling logic levels of the look-up table 28. The loop-up table 28 performs an operation on the logic input signal X in response to the control signal RE, thereby controlling the output signal Y.

Figure 15A:
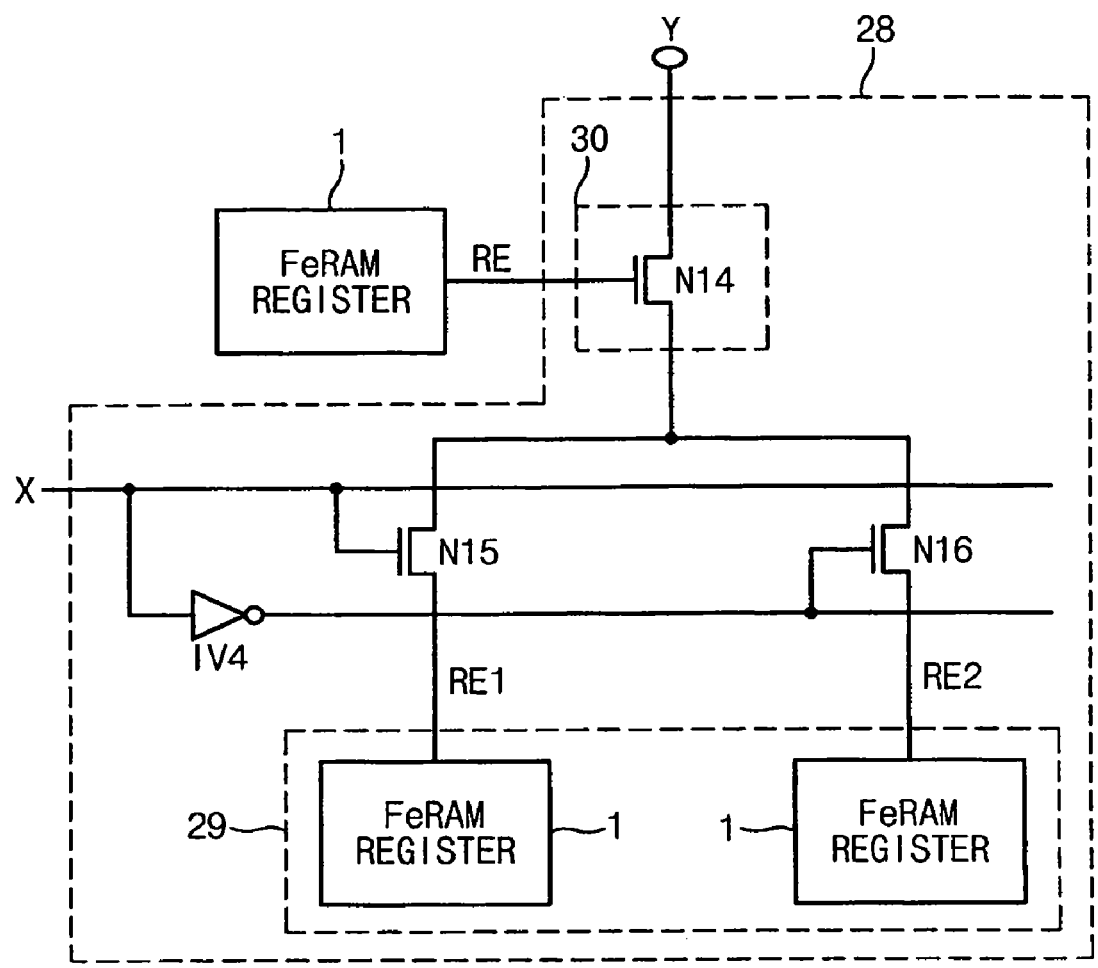
FIGS. 15a to 15c are circuit diagrams illustrating the nonvolatile programmable logic circuit of FIG. 14.

FIG. 15a is a circuit diagram illustrating the nonvolatile programmable logic circuit for controlling the 2-register input look-up table 28 of FIG. 14.

The look-up table 28 comprises a FeRAM register arrays 29 comprising two FeRAM registers 1 for storing data, an inverter IV4, NMOS transistors N15 and N16 and a transmission switch 30.

The FeRAM register 1 outputs the logic control signal RE for controlling the transmission switch 30. The transmission switch 30 comprises an NMOS transistor 14. The NMOS transistor N14, connected between an output terminal of the logic output signal Y and a common drain of the NMOS transistors N15 and N16, has a gate to receive the logic control signal RE.

The inverter IV4 inverts the logic input signal X. The NMOS transistor N15 outputs a logic control signal RE1 into the transmission switch 30 in response to the logic input signal X. The NMOS transistor N16 outputs a logic control signal RE2 into the transmission switch 30 in response to the output signal from the inverter IV4.

The nonvolatile programmable logic circuit controls the value of the logic output signal Y through different operation processes depending on kinds of data stored in the FeRAM register array 29.

For example, when the logic control signal RE is at the high level, the NMOS transistor N14 is turned on to determine the value of the logic output signal Y in response to the logic control signals RE1 and RE2.

When the logic control signals RE1 and RE2 are all at a low level, the voltage level of the logic output signal Y becomes at a low level. However, when the logic control signals RE1 and RE2 are all at a high level, the voltage level of the logic output signal Y becomes at a high level.

When the first logic control signal RE1 is at the high level and the second logic control signal RE2 is at the low level, the logic input signal X becomes the logic output signal Y. However, when the first logic control signal RE1 is at the low level and the second logic control signal RE2 is at the high level, the logic input signal X is inverted.

If the logic control signal RE is at the low level, the NMOS transistor N14 is turned off. As a result, the voltage level of the output signal Y is floated regardless of the logic control signals RE1 and RE2.

Figure 15B:
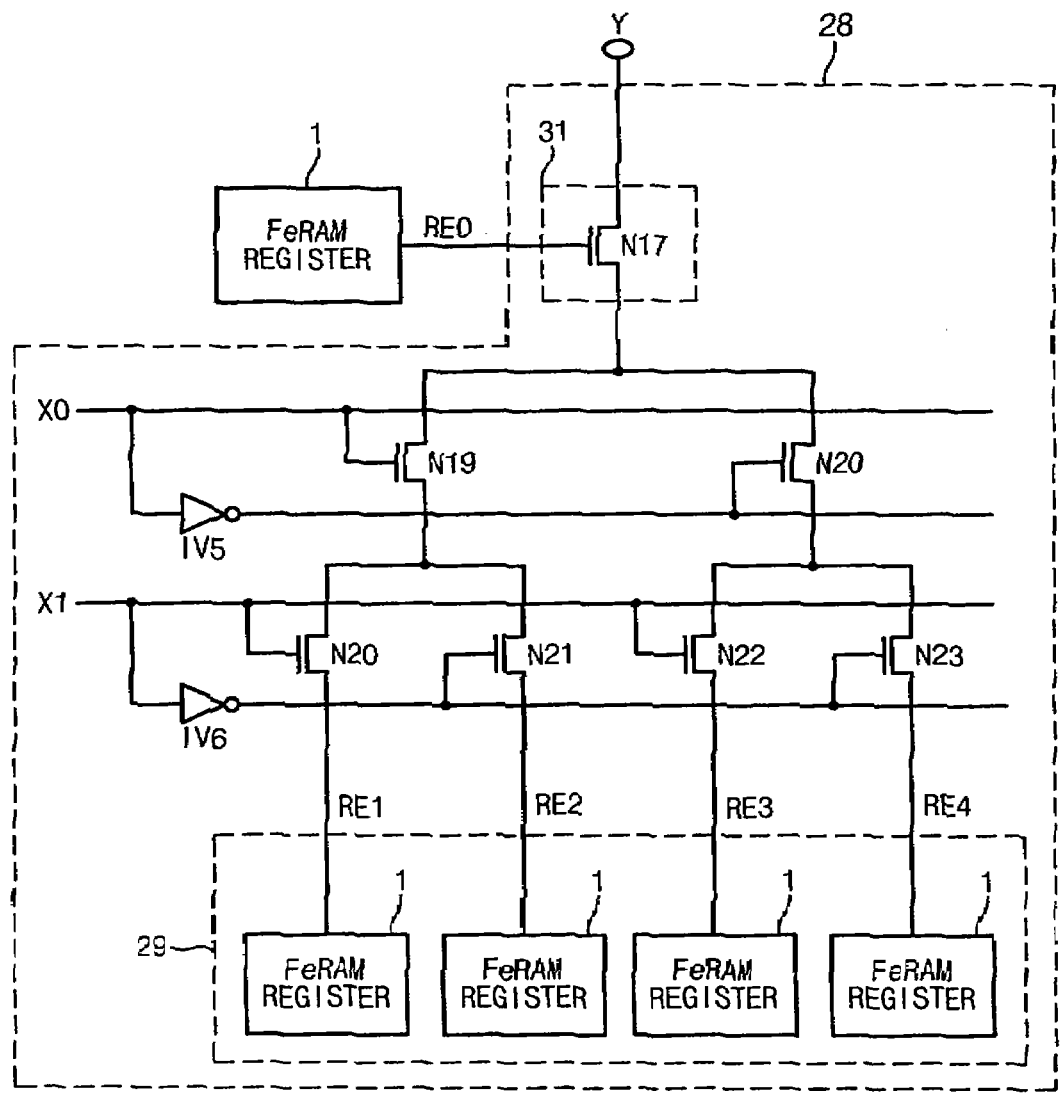

FIG. 15b is a circuit diagram illustrating the nonvolatile programmable logic circuit for controlling the 4-register input look-up table 28 of FIG. 14.

The look-up table 28 performs an operation on logic input signals X0 and X1 in response to logic control signals RE1~RE4 to control the logic output signal Y.

The look-up table 28 comprises a FeRAM register array 29, inverters IV5 and IV6, NMOS transistors N18~N23, a FeRAM register 1 and a transmission switch 31. The FeRAM register array 29 comprising four FeRAM registers 1 outputs logic control signals RE1~RE4 for controlling logic of the look-up table 28.

The FeRAM register 1 outputs the logic control signal RE for controlling the transmission switch 31. The transmission switch 31 comprises an NMOS transistor N17. The NMOS transistor N17, connected between an output terminal of the logic output signal Y and a common drain of the NMOS transistor N18 and N19, has a gate to receive the logic control signal RE.

The inverter IV5 inverts the first logic input signal X0. The NMOS transistor N18 outputs the first logic control signal RE1 and the second logic control signal RE2 into the transmission switch 31 in response to the first logic input signal X0. The NMOS transistor N19 outputs the third logic control signal RE3 and the fourth logic control signal RE4 in response to the output signal from the inverter IV5.

The inverter IV6 inverts the second logic input signal X1. The NMOS transistor N20 outputs the first logic control signal RE1 in response to the second logic input signal X1. The NMOS transistor N21 outputs the second logic control signal RE2 in response to the output signal from the inverter IV6. The NMOS transistor N22 outputs the third logic control signal RE3 in response to the second logic input signal X1. The NMOS transistor N23 outputs the fourth logic control signal RE4 in response to the output signal from the inverter IV6.

The logic control operation according to an embodiment of the present invention is represented as follows:

TABLE 1

| Logic control signal RE_1 | Logic control signal RE_2 | Logic control signal RE_3 | Logic control signal RE_4 | Operation of input signals X0 and X1 |
|---|---|---|---|---|
| L | L | L | H | NOR |
| L | H | H | L | XOR |
| L | H | H | H | NAND |
| H | L | L | L | AND |
| H | H | H | L | OR |

When the logic control signal RE is at the high level, the NMOS transistor N17 is turned on to determine the value of the logic output signal Y in response to the logic control signals RE1~RE4.

When the fourth logic control signal RE4 is at the high level and the rest logic control signals RE1~RE3 are at the low level, the logic output signal Y is an NOR operation result of the logic input signals X0 and X1. When the first logic control signal RE1 and the fourth logic control signal RE4 are at the low level and the second logic control signal RE2 and the third logic control signal RE3 are at the high level, the logic output signal Y is an exclusive logic operation result of the logic input signals X0 and X1.

When the first logic control signal RE1 is at the low level, the rest logic control signals RE2~RE4 are at the high level, the logic output signal Y is an NAND operation result of the logic input signal X0 and X1. When the first logic control signal RE1 is at the high level and the rest logic control signals RE2~RE4 are at the low level, the logic output signal Y is an AND operation result of the logic input signals X0 and X1. When the fourth logic control signal RE4 is at the low level and the rest logic control signals RE1~RE3 are at the high level, the logic output signal Y is an OR operation result of the logic input signals X0 and X1.

When the logic control signal RE is at the low level, the NMOS transistor N17 is turned off to float the voltage level of the logic output signal regardless of the logic control signals RE1~RE4.

Figure 15C:
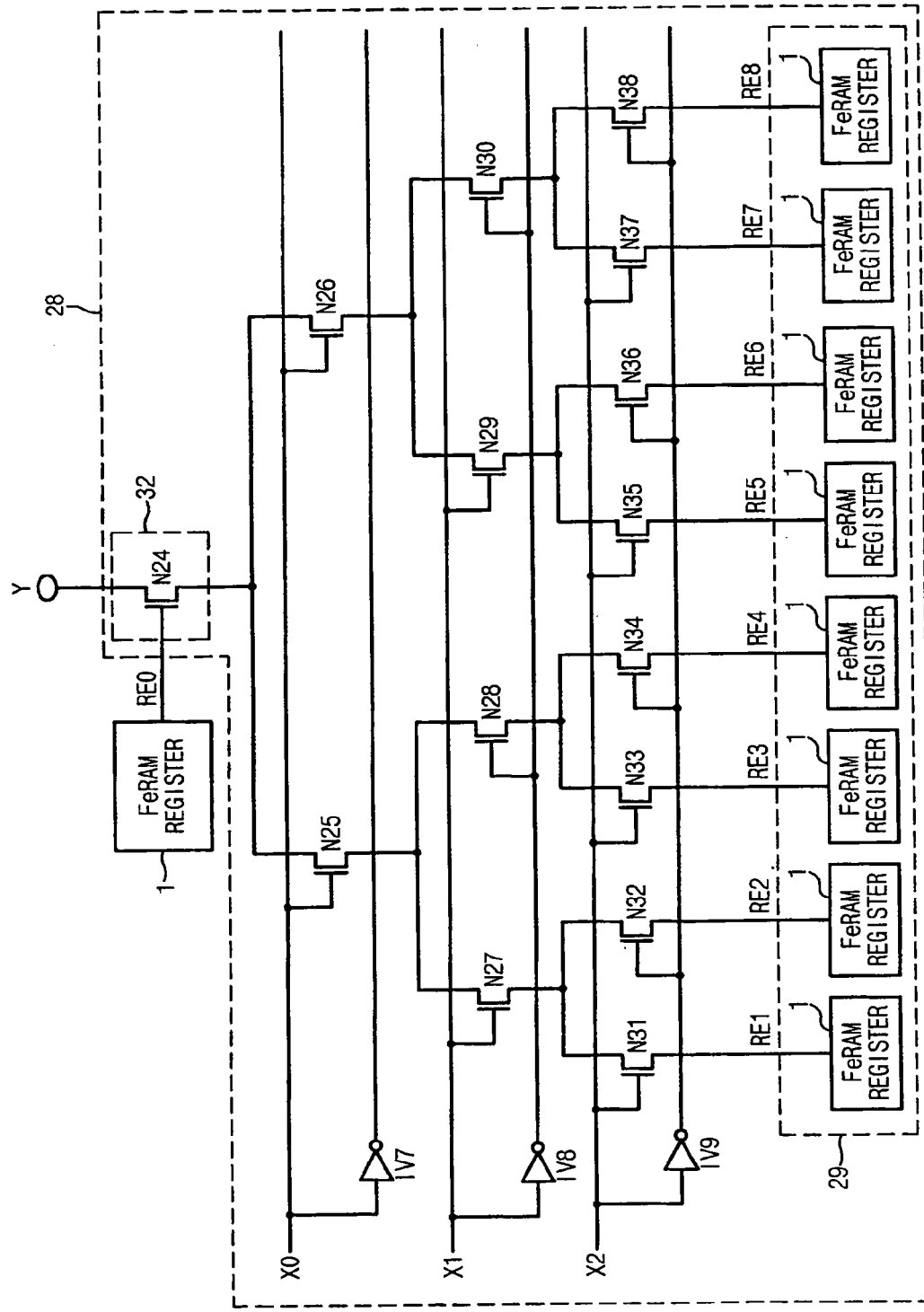

FIG. 15c is a circuit diagram illustrating the nonvolatile programmable logic circuit for controlling the 8-register input look-up table 28 of FIG. 14.

The look-up table 28 performs an operation on logic input signals X0, X1 and X2 in response to logic control signals RE1~RE8 to control the logic output signal.

The look-up table 29 comprises a FeRAM register array 29, inverters IV7~IV9, NMOS transistors N25~N38, a FeRAM register 1 and a transmission switch 32. The FeRAM register array 29 comprising eight FeRAM registers 1 outputs logic control signals RE1~RE8 to control logic of the look-up table 28.

The FeRAM register 1 outputs a logic control signal RE0 for controlling the transmission switch 32. The transmission switch 32 comprises an NMOS transistor N24. The NMOS transistor N24, connected between an output terminal of the logic output signal Y and a common drain of the NMOS transistors N25 and N26, has a gate to receive the logic control signal RE0.

The inverter IV7 inverts the first logic input signal X0. The NMOS transistor N25 outputs one of the logic control signals RE1~RE4 into the transmission switch 32 in response to the first logic input signal X0. The NMOS transistor N26 outputs one of the logic control signals RE5~RE8 into the transmission switch 32 in response to the output signal from the inverter IV7.

The inverter IV8 inverts the second logic input signal X1. The NMOS transistor N27 outputs the first logic control signal RE1 or the second logic control signal RE2 into the NMOS transistor N25 in response to the second logic input signal X1. The NMOS transistor N28 outputs the third logic control signal RE3 or the fourth logic control signal RE4 into the NMOS transistor N25 in response to the output signal from the inverter IV8.

The NMOS transistor N29 outputs the fifth logic control signal RE5 or the sixth logic control signal RE6 into the NMOS transistor N26 in response to the second logic input signal. The NMOS transistor N30 outputs the seventh logic control signal RE7 or the eighth logic control signal into the NMOS transistor N26 into the NMOS transistor N26.

The inverter IV9 inverts the third logic input signal X2. The NMOS transistor N31 outputs the first logic control signal RE1 into the NMOS transistor N27 in response to the third logic input signal X2. The NMOS transistor N32 outputs the second logic control signal RE2 into the NMOS transistor N27 in response to the output signal from the inverter IV9. The NMOS transistor N33 outputs the third logic control signal RE3 into the NMOS transistor N28 in response to the third logic input signal X2. The NMOS transistor N34 outputs the fourth logic control signal RE4 into the NMOS transistor N28 in response to the output signal from the inverter IV9.

The NMOS transistor N35 outputs the fifth logic control signal RE5 into the NMOS transistor N29 in response to the third input signal X2. The NMOS transistor N36 outputs the sixth logic control signal RE6 into the NMOS transistor N29 in response to the output signal from the inverter IV9. The NMOS transistor N37 outputs the seventh logic control signal RE7 into the NMOS transistor N30 in response to the third logic input signal X2. The NMOS transistor N38 outputs the eighth logic control signal RE8 into the NMOS transistor N30 in response to the output signal from the inverter IV9.

The nonvolatile programmable logic circuit of FIG. 15 performs a logic operation on the logic input signals X0, X1 and X2 in response to the logic control signals RE1~RE8 to determine the value of the logic output signal Y.

If the logic control signal RE is at the low level, the NMOS transistor N24 is turned off to float the voltage level of the logic output signal Y regardless of the logic control signals RE1~RE8.

Figure 16:
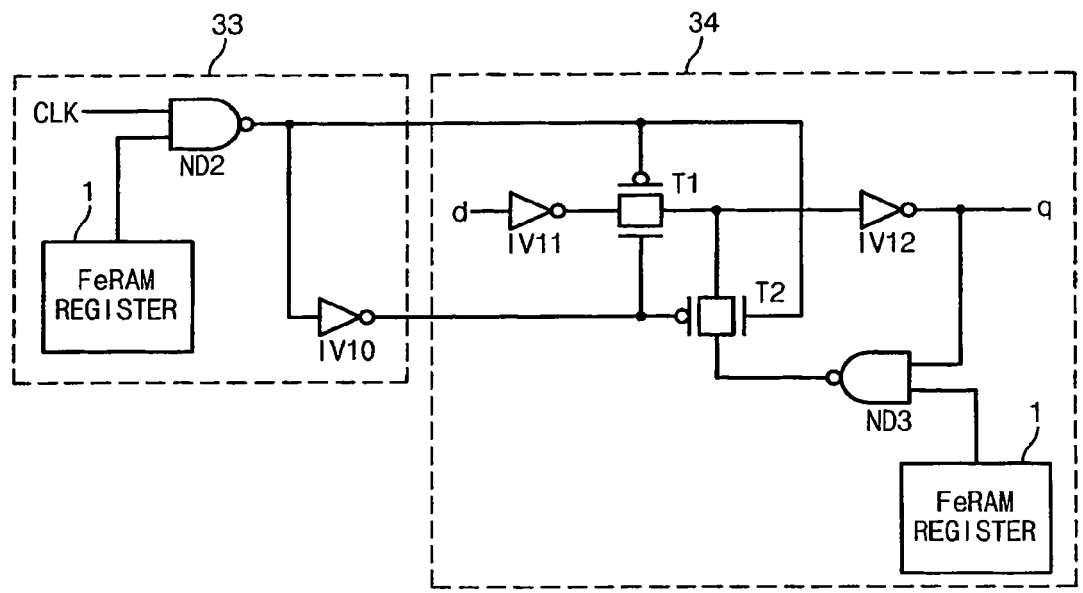
FIGS. 16 to 18 are circuit diagrams illustrating the nonvolatile programmable logic circuit for controlling logic levels of a D-latch using a FeRAM register.

FIG. 16 is a circuit diagram illustrating the nonvolatile programmable logic circuit for controlling logic levels of a D-latch using a FeRAM register 1.

The nonvolatile programmable logic circuit of FIG. 16 comprises a latch controller 33 and a latch unit 34.

The latch controller 33 comprises a FeRAM register 1, an NAND gate ND2 and an inverter IV10. The NAND gate ND2 performs an NAND operation on the clock signal CLK and an output signal from the FeRAM register 1. The inverter IV10 inverts an output signal from the NAND gate ND2.

The latch unit 34 comprises inverters IV11 and IV12, transmission gates T1 and T2, an NAND operation ND3 and a FeRAM register 1. The inverter IV11 inverts an input signal inputted through an input terminal d. The first transmission gate T1 selectively transmits an output signal from the inverter IV11 in response to an output signal applied from the latch controller 33. The inverter IV12 inverts an output signal from the first transmission gate T1 and outputs the inverted signal into an output terminal q.

The NAND gate ND3 performs an NAND operation on an output signal from the FeRAM register 1 to control a reset operation and an output signal from the inverter IV12. The second transmission gate T2 selectively transmits an output signal from the NAND gate ND3 in response to an output signal from the latch controller 33.

In the embodiment of FIG. 16, the clock signal CLK is selectively outputted in response to an output signal from the FeRAM register 1 of the latch controller 33. When the output signal from the FeRAM register 1 is at a high level, the clock signal CLK is outputted into the latch unit 34. However, when the output signal from the FeRAM register 1 is at a low level, the clock signal CLK is not outputted into the latch unit 34.

The FeRAM register 1 of the latch unit 34 controls a reset operation of the latch unit 34. When the output signal from the FeRAM register 1 is at the high level, a normal latch operation is performed. When the output signal from the FeRAM register 1 is at the low level, an output signal from the latch unit 34 is reset.

Figure 17:
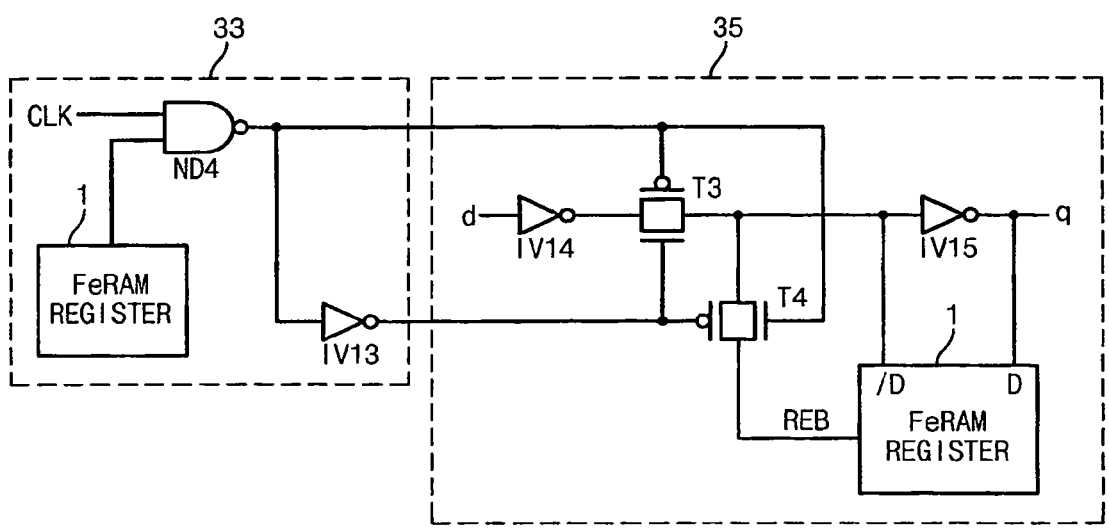

FIG. 17 is a circuit diagram of another example of the nonvolatile programmable logic circuit of FIG. 16.

The nonvolatile programmable logic circuit of FIG. 17 comprises a latch controller 33 and a latch unit 35.

The latch controller 33 comprises a FeRAM register 1, an NAND gate ND4 and an inverter IV13. The NAND gate ND4 performs an NAND operation on the clock signal CLK and an output signal from the FeRAM register 1. The inverter IV13 inverts an output signal from the NAND gate ND4.

The latch unit 35 comprises inverters IV14 and IV15, transmission gates T3 and T4 and a FeRAM register 1. The third transmission gate T3 selectively transmits an output signal from the inverter IV14 in response to an output signal applied from the latch controller 33. The inverter IV15 inverts a signal transmitted from the third transmission gate T3, and outputs the inverted signal into an output terminal q.

The signal transmitted from the third transmission gate T3 is inputted into an inversion input terminal /D of the FeRAM register 1. An output signal from the inverter IV15 is inputted into a non-inversion input terminal D of the FeRAM register 1. The fourth transmission gate T4 selectively transmits the logic control signal REB in response to the output signal from the latch controller 33.

In the embodiment of FIG. 17, the clock signal CLK is selectively outputted in response to the output signal from the FeRAM register 1 of the latch controller 33. When the output signal from the FeRAM register 1 is at a high level, the clock signal CLK is outputted into the latch unit 35. However, when the output signal from the FeRAM register 1 is at a low level, the clock signal CLK is not outputted into the latch unit 35.

The FeRAM register 1 of the latch unit 35 stores data inputted in the latch unit 35. As a result, the data stored in the FeRAM register 1 can be restored when power is re-supplied after a power off mode.

Figure 18:
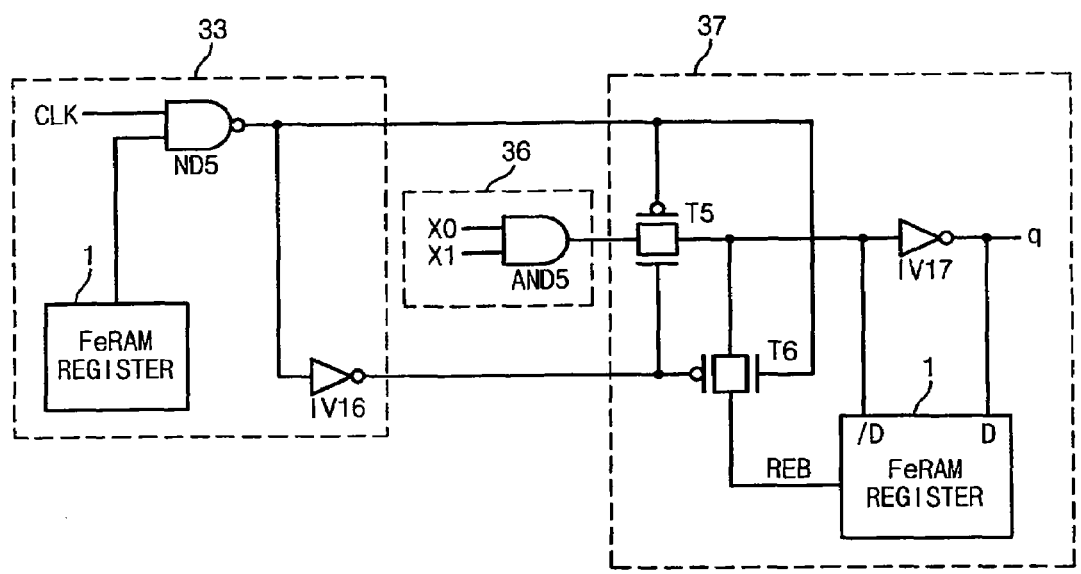

FIG. 18 is a circuit diagram of still another example of the nonvolatile programmable logic circuit of FIG. 16.

The nonvolatile programmable logic circuit of FIG. 18 comprises a latch controller 33, a operation unit 36 and a latch unit 37.

The latch controller 33 comprises a FeRAM register 1, an NAND gate ND5 and an inverter IV16. The NAND gate ND5 performs an NAND operation on the clock signal CLK and an output signal from the FeRAM register 1. The inverter IV16 inverts an output signal from the NAND gate ND5.

The operation unit 36 comprises an AND gate AND5 for performing an AND operation on logic input signals X0 and X1.

The latch unit 37 comprises transmission gates T5 and T6, an inverter IV17 and a FeRAM register 1. The fifth transmission gate T5 selectively transmits an output signal from the AND gate AND5 in response to an output signal applied from the latch controller 33. The inverter IV17 inverts an output signal from the fifth transmission gate T5, and outputs the inverted signal into an output terminal q.

The signal transmitted from the fifth transmission gate T5 is inputted into an inversion input terminal /D of the FeRAM register 1. An output signal from the inverter IV17 is inputted into a non-inversion input terminal D of the FeRAM register 1. The sixth transmission gate T6 selectively transmits the logic control signal REB in response to an output signal from the latch controller 33.

In the embodiment of FIG. 18, the clock signal CLK is selectively outputted in response to the output signal from the FeRAM register 1 of the latch controller 33. When the output signal from the FeRAM register 1 is at a high level, the clock signal CLK is outputted into the latch unit 37. However, when the output signal from the FeRAM register 1 is at a low level, the clock signal CLK is not outputted into the latch unit 37.

The FeRAM register 1 of the latch unit 37 stores data inputted in the latch unit 37. As a result, the data stored in the FeRAM register 1 can be restored when power is re-supplied after a power off mode.

Figure 19:
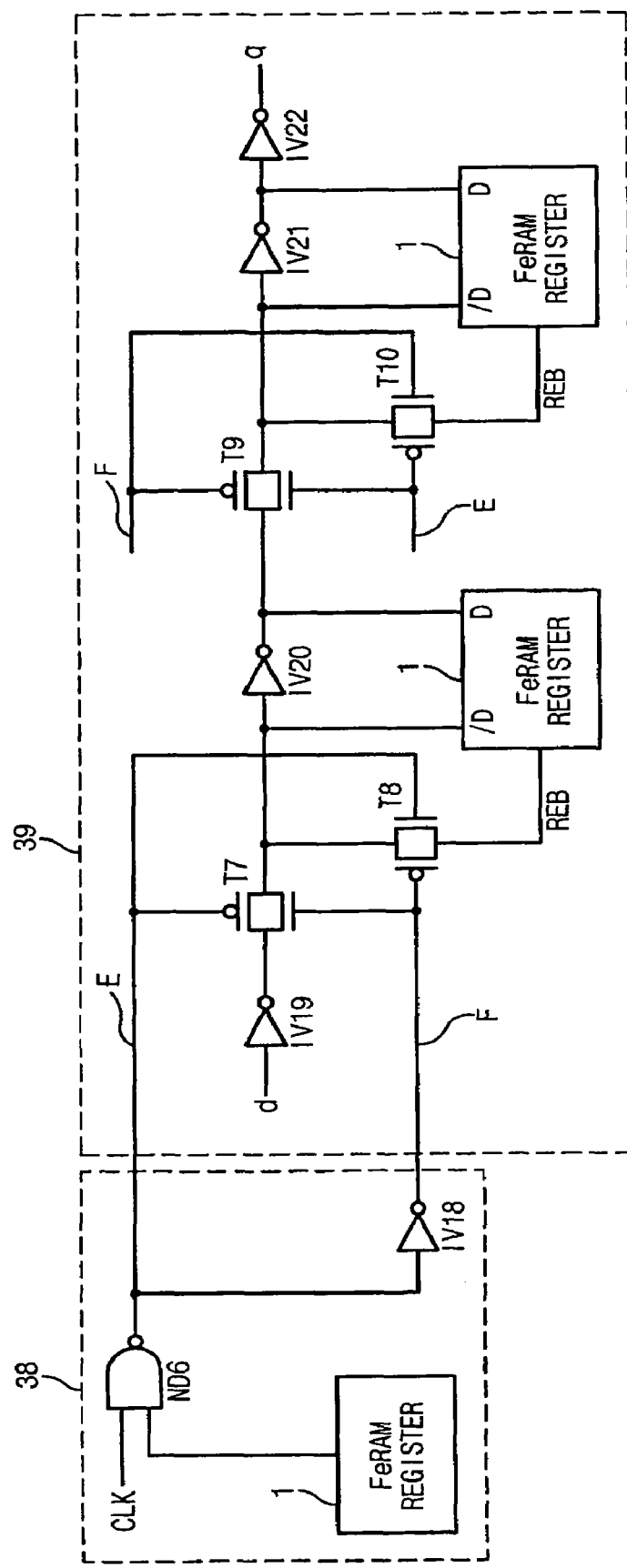
FIGS. 19 to 21 are circuit diagrams illustrating the nonvolatile programmable logic circuit for controlling logic levels of a flip-flop using a FeRAM register.

FIG. 19 is a circuit diagram illustrating the nonvolatile programmable logic circuit for controlling logic levels of a flip-flop using a FeRAM register 1.

The nonvolatile programmable logic circuit of FIG. 19 comprises a logic controller 38 and a flip-flop unit 39.

The logic controller 38 comprises a FeRAM register 1, an NAND gate ND6 and an inverter IV18. The NAND gate ND6 performs an NAND operation on the clock signal CLK and an output signal from the FeRAM register 1. The inverter IV18 inverts an output signal from the NAND gate ND5.

The flip-flop unit 39 comprises inverters IV19~IV22, transmission gates T7~T10 and two FeRAM registers 1. The seventh transmission gate T7 selectively transmits an output signal from the inverter IV19 in response to an output signal applied from the logic controller 38.

The signal transmitted from the seventh transmission gate T7 is inputted into an inversion input terminal /D of the first FeRAM register 1. An output signal from the inverter IV20 is inputted into a non-inversion input terminal D of the first FeRAM register 1. The eighth transmission gate T8 selectively transmits the logic control signal REB in response to an output signal from the logic controller 38.

The ninth transmission gate T9 selectively transmits an output signal from the inverter IV20 in response to an output signal applied from the logic controller 38. The signal transmitted from the ninth transmission gate T9 is inputted into an inversion input terminal /D of the second FeRAM register 1. An output signal from the inverter IV21 is inputted into a non-inversion input terminal D of the second FeRAM register 1. The tenth transmission gate T10 selectively transmits the logic control signal REB in response to an output signal from the logic controller 38. The inverter IV22 inverts an output signal from the inverter IV21, and outputs the inverted signal into an output terminal q.

In the embodiment of FIG. 19, the clock signal CLK is inputted in response to the output signal from the FeRAM register 1. When the output signal from the FeRAM register 1 is at a high level, the clock signal CLK is outputted into the flip-flop unit 39. However, when the output signal from the FeRAM register 1 is at a low level, the clock signal CLK is not inputted into the flip-flop unit 39.

The two FeRAM registers 1 of the flip-flop unit 39 store data inputted in the flip-flop unit 39. As a result, the data stored in the FeRAM register 1 can be restored when power is re-supplied after a power-off mode.

Figure 20:
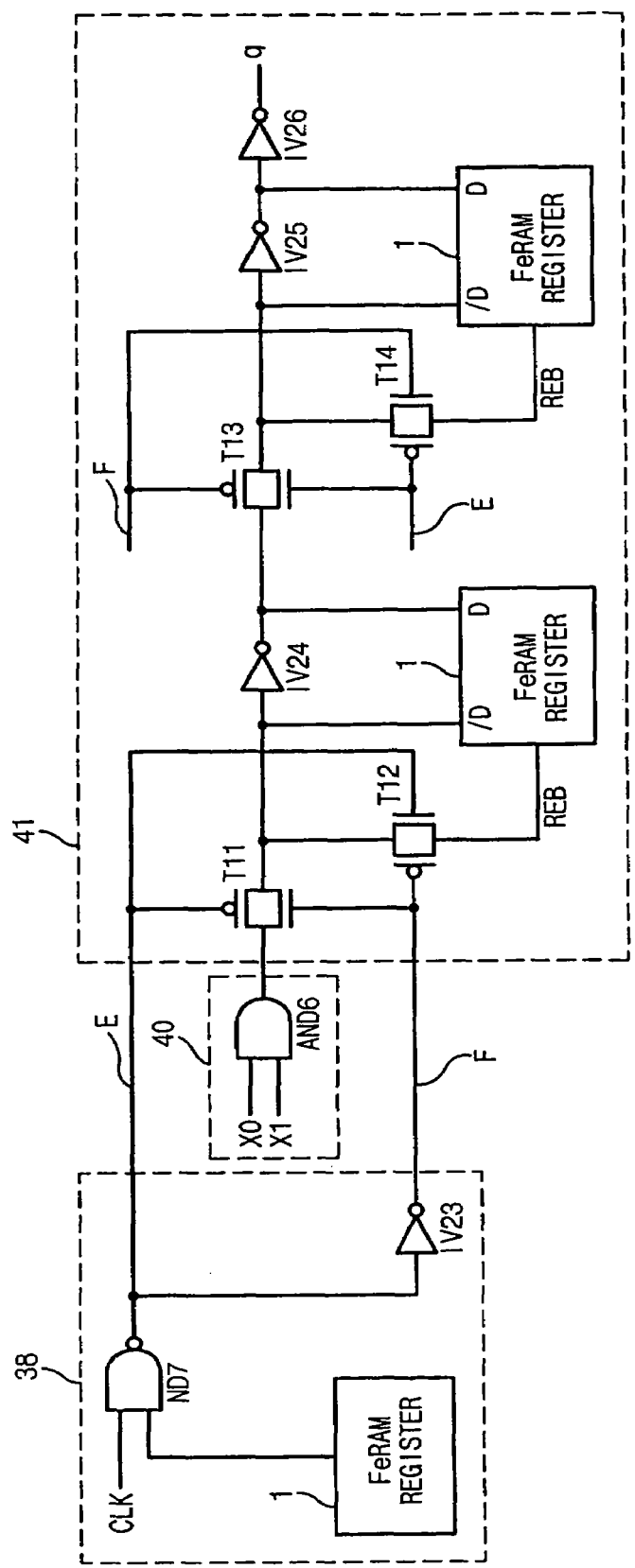

FIG. 20 is a circuit diagram illustrating another example of FIG. 19.

The nonvolatile programmable logic circuit of FIG. 20 comprises a logic controller 38, an operation unit 40 and a flip-flop unit 41.

The logic controller 38 comprises a FeRAM register 1, an NAND gate ND7 and an inverter IV23. The NAND gate ND7 performs an NAND operation on the clock signal CLK and an output signal from the FeRAM register 1. The inverter IV23 inverts an output signal from the NAND gate ND7.

The operation unit 40 comprises an AND gate AND6 for performing an AND operation on logic input signals X0 and X1.

The flip-flop unit 41 comprises inverters IV24~IV26, transmission gate T11-T14 and two FeRAM register 1. The $11^{th}$ transmission gate T11 selectively transmits an output signal from the AND gate AND6 in response to an output signal applied from the logic controller 38. The signal transmitted from the $11^{th}$ transmission gate T11 is inputted into an inversion input terminal /D of the FeRAM register 1. An output signal from the inverter IV24 is inputted into a non-inversion input terminal D of the FeRAM register 1. The $12^{th}$ transmission gate T12 selectively transmits the logic control signal REB in response to an output signal from the logic controller 38.

The $13^{th}$ transmission gate T13 selectively transmits an output signal from the inverter IV24 in response to the output signal applied from the logic controller 38. The signal transmitted from the $13^{th}$ transmission gate T13 is inputted into an inversion input terminal /D of the first FeRAM register 1. An output signal from the inverter IV25 is inputted into a non-inversion input terminal D of the second FeRAM register 1. The $14^{th}$ transmission gate T14 selectively transmits the logic control signal REB in response to the output signal from the logic controller 38. The inverter IV26 inverts the output signal from the inverter IV25, and outputs the inverted signal into an output terminal q.

In the embodiment of FIG. 20, an output signal from the operation unit 40 is inputted into the flip-flop unit 41. In the embodiment of FIG. 20, the clock signal CLK is inputted in response to the output signal from the FeRAM register 1. When the output signal from the FeRAM register 1 is at a high level, the clock signal CLK is outputted into the flip-flop unit 41. However, when the output signal from the FeRAM register 1 is at a low level, the clock signal CLK is not inputted into the flip-flop unit 41. The two FeRAM registers of the flip-flop unit 41 store data inputted in the flip-flop unit 41. As a result, the data stored in the FeRAM register 1 can be restored when power is re-supplied after a power-off mode.

Figure 21:
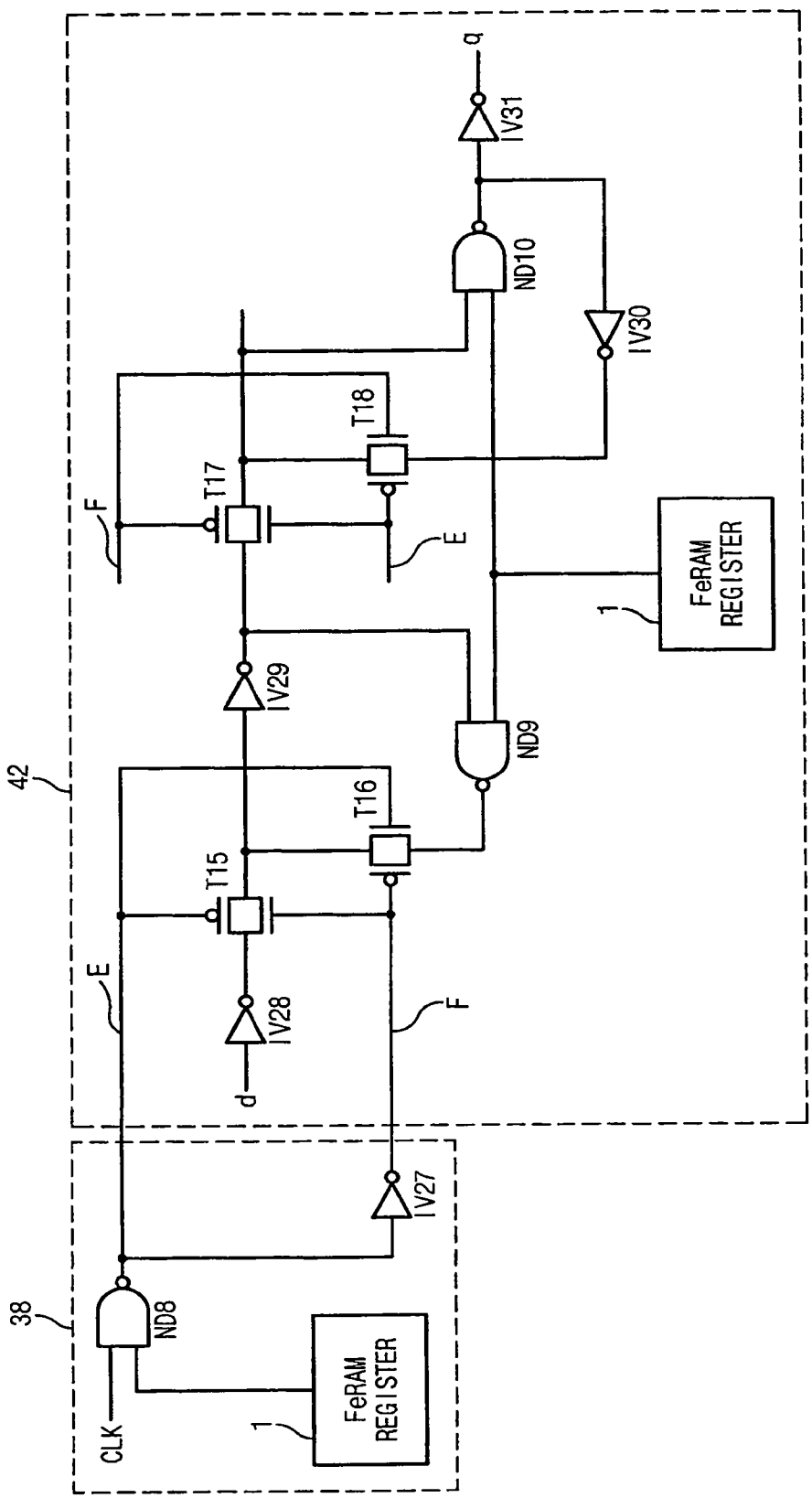

FIG. 21 is a circuit diagram illustrating still another example of FIG. 19.

The nonvolatile programmable logic circuit of FIG. 21 comprises a logic controller 38 and a flip-flop unit 42.

The logic controller 38 comprises a FeRAM register 1, an NAND gate ND8 and an inverter IV27. The NAND gate ND8 performs an NAND operation on the clock signal CLK and an output signal from the FeRAM register 1. The inverter IV27 inverts an output signal from the NAND gate ND8.

The flip-flop unit 42 comprises inverters IV28~IV31, transmission gates T15~T18, an NAND gates ND9 and ND10 and a FeRAM register 1. The $15^{th}$ transmission gate T15 selectively transmits an output signal from the inverter IV28 in response to an output signal applied from the logic controller 38. The NAND gate ND9 performs an NAND operation on output signals from the inverter IV29 and the FeRAM register 1. The $16^{th}$ transmission gate T16 selectively transmits an output signal from the NAND gate ND9 in response to the output signal from the logic controller 38.

The $17^{th}$ transmission gate T17 selectively transmits the output signal from the inverter IV29 in response to the output signal applied from the logic controller 38. The NAND gate ND10 performs an NAND operation on the signal transmitted from the $17^{th}$ transmission gate T17 and the output signal from the FeRAM register 1. The $18^{th}$ transmission gate T18 selectively transmits an output signal from the inverter IV30 in response to the output signal from the logic controller 38.

In the embodiment of FIG. 21, the FeRAM register 1 of the flip-flop unit 42 controls a reset operation of the flip-flop unit 42. If the output signal from the FeRAM register 1 is at a high level, a normal flip-flop operation is possible. If the output signal from the FeRAM register 1 is at a low level, the flip-flop unit 42 is reset.

Figure 22:
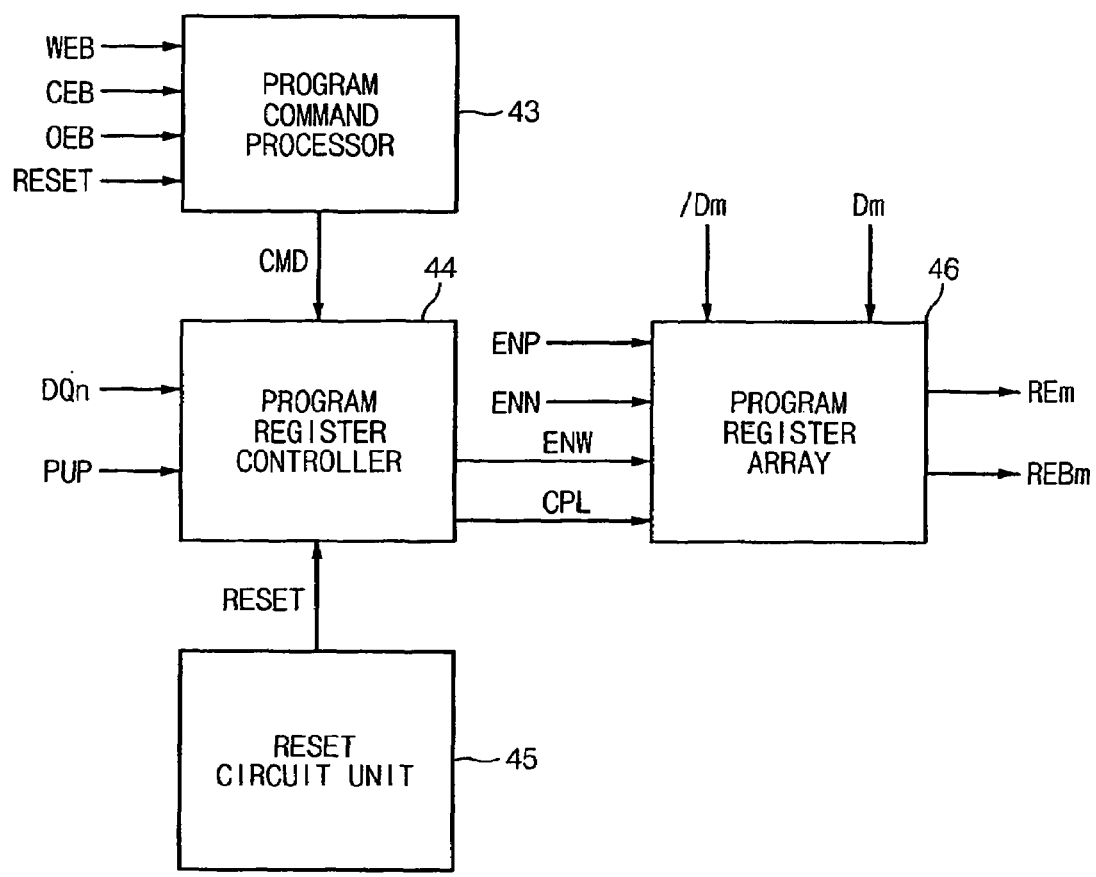
FIG. 22 is a block diagram illustrating a logic circuit to program a FeRAM register according to an embodiment of the present invention.

FIG. 22 is a block diagram illustrating a logic circuit for programming a FeRAM register 1 according to an embodiment of the present invention.

In an embodiment, the program logic circuit comprises comprises a program command processor 43, a program register controller 44, a reset circuit unit 45 and a program register array 46.

The program command processor 43 codes program commands in response to a write enable signal WEB, the chip enable signal CEB, an output enable signal OEB and a reset signal RESET, and outputs a command signal CMD. The program register controller 44 logically combines the command signal CMD, a power-up detecting signal PUP and input data DQn, and outputs a write control signal ENW and a cell plate signal CPL.

In a power-up mode, the reset circuit unit 45 outputs the reset signal RESET into the program register controller 44.

The program register array 46 programs externally inputted data Dm and /Dm in response to a pull-up enable signal ENP, a pull-down enable signal ENN, a write control signal ENW and a cell plate signal CPL, and outputs register control signals REm and REBm.

If the command signal CMD is generated from the program command processor 43, the program register controller 44 changes or sets configuration data of a program in the program register array 46.

The reset circuit unit 45 generates the reset signal RESET in the power-up mode, thereby activating the program register controller 44. Control signals outputted from the program register controller 44 are to initialize nonvolatile data of the program register array 46.

Figure 23:
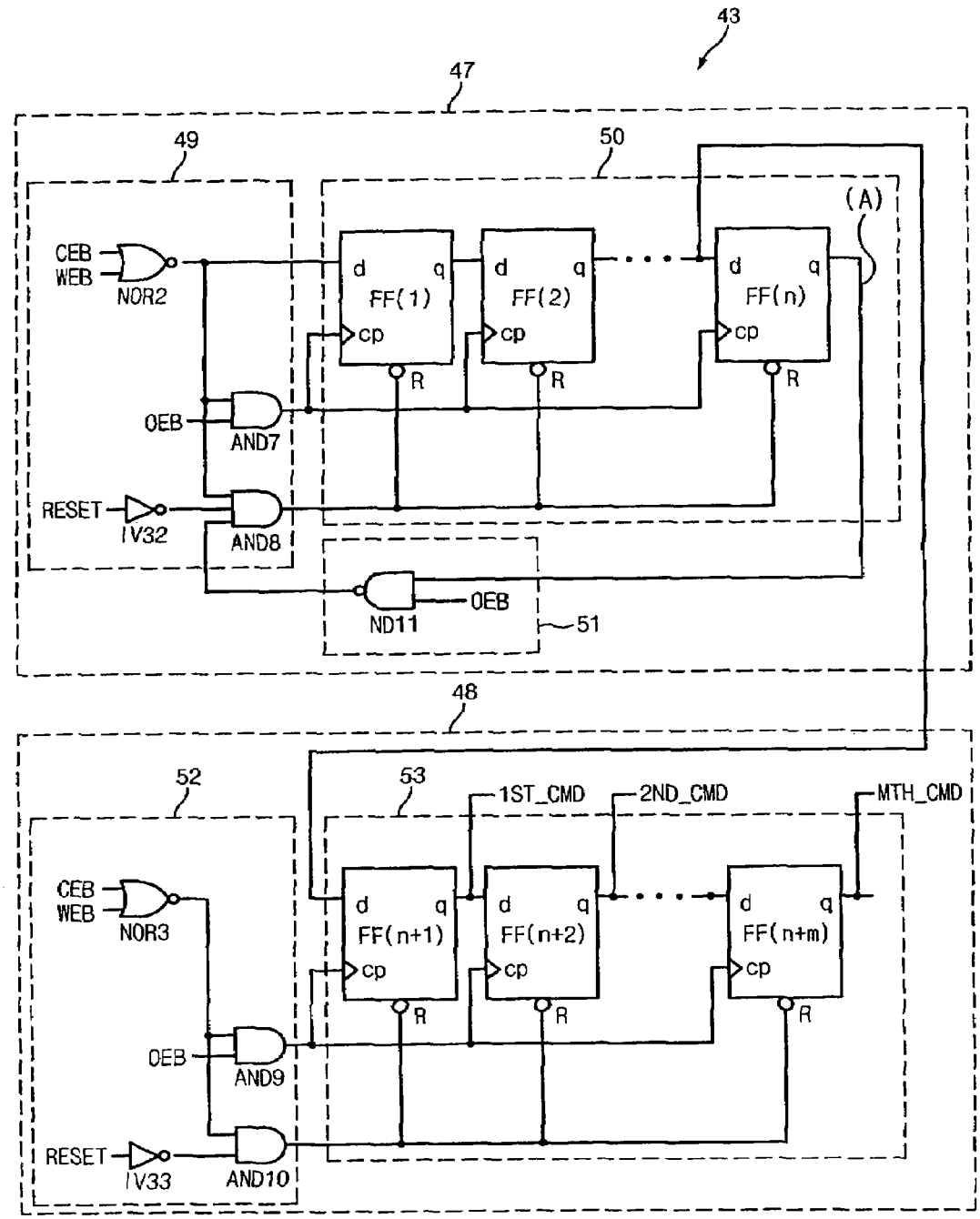
FIG. 23 is a circuit diagram illustrating a program command processor of FIG. 22.

FIG. 23 is a circuit diagram illustrating the program command processor 43 of FIG. 22.

The program command processor 43 comprises a command controller 47 and a multiple command generator 48.

The command controller 47 comprises a logic unit 49, a flip-flop unit 50 and an over-toggle detector 51.

The logic unit 49 comprises an NOR gate NOR2, an AND gates AND7 and AND8 and an inverter IV32. The NOR gate NOR2 performs an NOR operation on the write enable signal WEB and the chip enable signal CEB. The AND gate AND7 performs an AND operation on an output signal from the NOR gate NOR2 and the output enable signal OEB. The inverter IV32 inverts the reset signal RESET. The AND gate AND8 performs an AND operation on the output signal from the NOR gate NOR2, an output signal from the inverter IV32 and an output signal from the over-toggle detector 51.

The flip-flop unit 50 comprises n flip-flops FF connected serially. The first flip-flop FF(1) has an input terminal d to receive the output signal from the NOR gate NOR2. Also, each flip-flop FF has an input terminal cp to receive an activation synchronizing signal outputted from the AND gate AND7, and a reset terminal R to receive a reset signal outputted from the AND gate AND8.

Here, the input terminal cp of the flip-flop FF receives the output enable signal OEB when the chip enable signal CEB and the write enable signal WEB are at a low level. The reset terminal R of the flip-flop FF receives a low level signal if one of the chip enable signal CEB and the write enable signal WEB becomes at a high level. In the power-up mode, the flip-flop FF is reset while the reset signal RESET is at a high level.

The over-toggle detector 51 comprises an NAND gate ND11 for performing an NAND operation on the output signal from the node A and the output enable signal OEB. The over-toggle detector 51 resets the flip-flop unit 50 when the output enable signal OEB toggles over n times to cause over-toggle. Therefore, the number of toggle in the program command processor 43 is set to be different.

The multiple command generator 48 comprises a logic unit 52 and a flip-flop unit 53.

The logic unit 52 comprises an NOR gate NOR3, AND gates AND9 and AND10 and an inverter IV33. The NOR gate NOR3 performs an NOR operation on the write enable signal WEB and the chip enable signal CEB. The AND gate AND9 performs an AND operation on an output signal from the NOR gate NOR3 and the output enable signal OEB. The inverter IV33 inverts the reset signal RESET. The AND gate AND10 performs an AND operation on the output signal from the AND gate AND3 and the output signal from the inverter IV33.

The flip-flop unit 53 comprises m flip-flops FF connected serially. The first flip-flop FF(n+1) has an input terminal d to receive an output signal from the flip-flop FF(n−1) of the command controller 47. Through input terminals d and output terminals q serially connected each other, a high pulse outputted from the flip-flop FF(n+1) sequentially moves into the next flip-flop. As a result, the flip-flops FF sequentially output a plurality of command signal such as a $1^{st}$_CMD, a $2^{nd}$_CMD, . . . , a $m^{th}$_CMD.

Each flip-flop has an input terminal cp to receive an activation synchronization signal outputted from the AND gate AND9, and a reset terminal R to receive a reset signal outputted from the AND gate AND10.

When the chip enable signal CEB and the write enable signal WEB are at a low level, the output enable signal OEB is inputted into the input terminal cp of each flip-flop FF. When one of the chip enable signal CEB or write enable signal WEB becomes at a high level, a low level signal is inputted into the reset terminal R of each flip-flop FF, and the flip-flop is reset. While the reset signal RESET is at a high level, the flip-flop FF is reset in the power-up mode.

Figure 24:
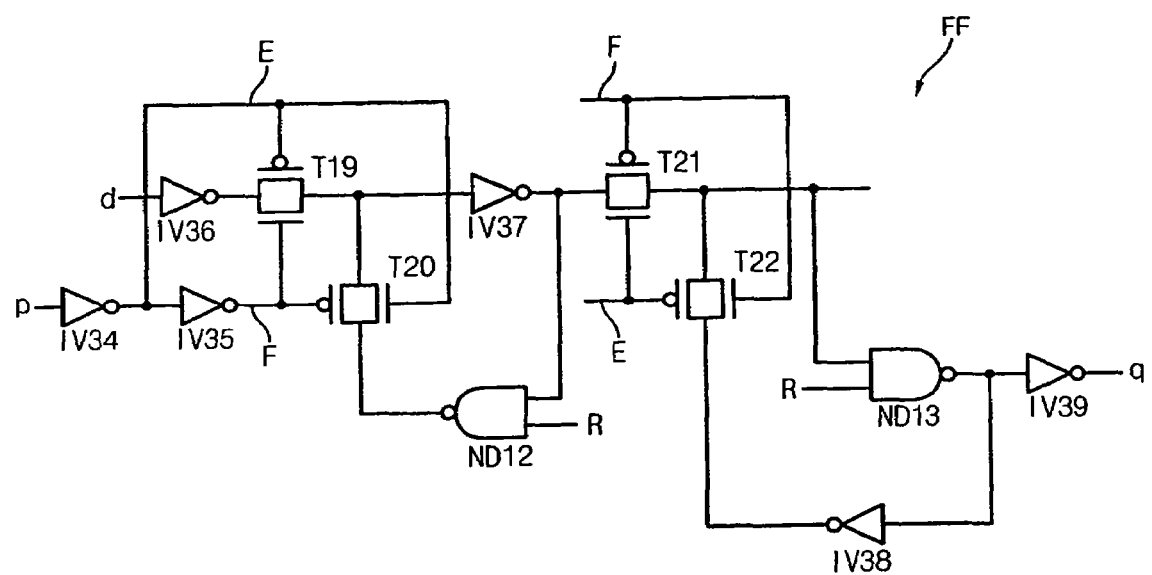
FIG. 24 is a circuit diagram illustrating a flip-flop of FIG. 23.

FIG. 24 is a circuit diagram illustrating the flip-flop of FIG. 23.

The flip-flop FF comprises transmission gates T19~T22, NAND gates ND12 and ND13, and inverters IV34~IV39.

Here, the inverter IV34 inverts an output signal from the input terminal cp, and the inverter IV35 inverts an output signal from the inverter IV34.

The inverter IV36 inverts the data inputted through the input terminal d.

The $19^{th}$ transmission gate T19 selectively outputs an output signal from the inverter IV36 depending on output signals E and F from the inverters IV34 and IV35. The inverter IV39 inverts an output signal from the $19^{th}$ transmission gate T19. The NAND gate ND12 performs an NAND operation on output signal from the inverter IV37 and the reset terminal R. The $20^{th}$ transmission gate T20 selectively outputs an output signal from the NAND gate ND12 depending on the output signals E and F from the inverters IV34 and IV35.

The $21^{th}$ transmission gate T21 selectively outputs an output signal from the inverter IV37 depending on the output signals E and F from the inverters IV34 and IV35. The NAND gate ND13 performs an NAND operation on output signals from the $21^{th}$ transmission gate T21 and the reset terminal R.

The inverter IV38 inverts an output signal from the NAND gate ND13.

The $22^{nd}$ transmission gate T22 selectively outputs an output signal from the inverter IV38 depending on the output signals E and F from the inverters IV34 and IV35. The inverter IV39 inverts an output signal from the NAND gate ND13, and outputs the inverted signal into the output terminal q.

Data inputted from the input terminal d are transmitted by the transmission gates T19 and T21 whenever a control signal inputted through the input terminal cp toggles once. When a low level signal is inputted into the reset terminal R, a low level signal is outputted into the output terminal q to reset the flip-flop FF.

Figure 25:
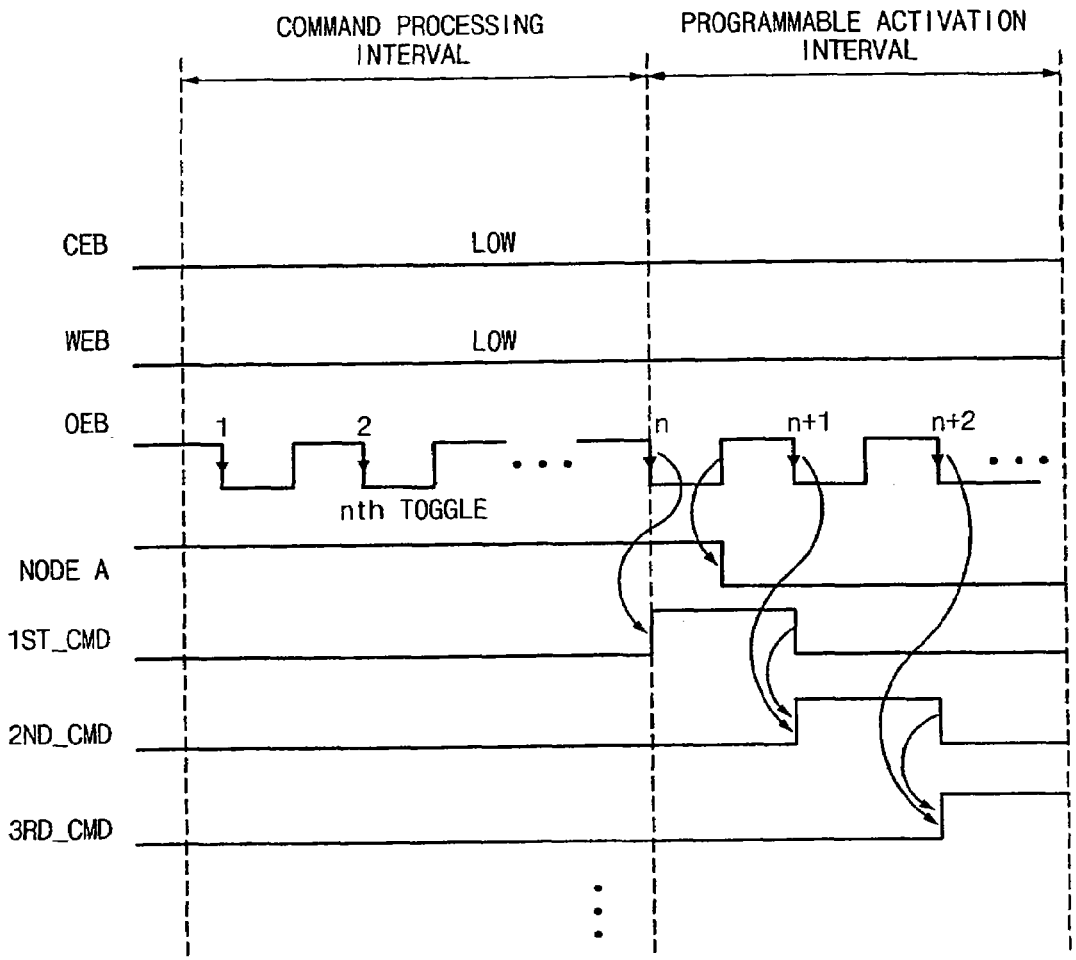
FIG. 25 is a timing diagram illustrating the operation of the program command processor of FIG. 22.

FIG. 25 is a timing diagram illustrating the operation of the program command processor 43 of FIG. 22.

In a command processing interval, the chip enable signal CEB and the write enable signal WEB are maintained at a low level. While the output enable signal OEB toggles n times, the command signal CMD is maintained at a low level.

Thereafter, if an programmable activation interval starts and the output enable signal OEB toggles n times, the command signal $1^{st}$_CMD outputted from the flip-flop FF(n+1) is enabled to a high level.

If the over-toggle detector 51 detects over-toggle after the $n^{th}$ toggle, the output signal of the node A becomes at a low level. Here, since an output signal of the flip-flop FF(n−1) is inputted into the flip-flop FF(n+1), the multiple command generator 48 is not affected by the over-toggle detector 51.

Next, if the $(n+1)^{th}$ toggle occurs, the command signal $1^{st}$_CMD becomes at a low level, and the command signal $2^{nd}$_CMD outputted from the flip-flop FF(n+2) is enabled to a high level. When the number of toggles of the output signal OEB is regulated, the number of flip-flops FF connected serially is regulated.

Figure 26:
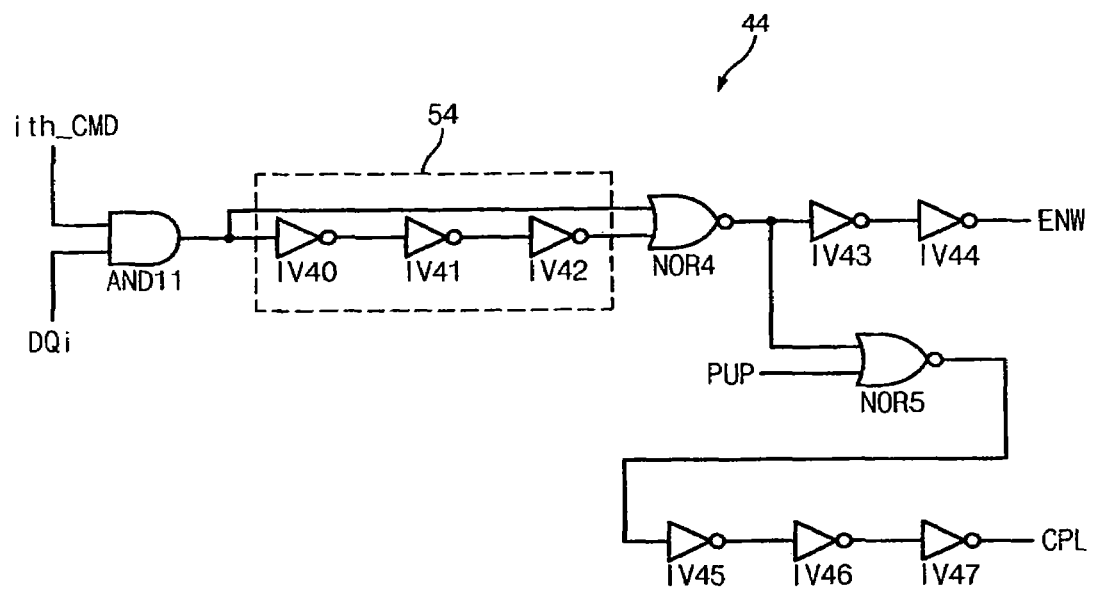
FIG. 26 is a circuit diagram illustrating the program register controller of FIG. 22.

FIG. 26 is a circuit diagram illustrating the program register controller 44 of FIG. 22.

The program register controller 44 comprises a delay unit 54, an AND gate AND11, inverters IV43~IV47, and NOR gates NOR4 and NOR5. The AND gate AND11 performs an AND operation on the command signal $i^{th}$_CMD and input data DQi. The delay unit 54 which comprises the inverters IV40~IV42 connected in series delays an output signal from the AND gate AND11.

The NOR gate NOR4 performs an NOR operation on output signals from the AND gate AND11 and the delay unit 54. The inverter IV43 and IV44 delay an output signal from the NOR gate NOR4 to output the write control signal ENW.

The NOR gate NOR5 performs an NOR operation on an output signal from the NOR gate NOR4 and the power-up detecting signal PUP. The inverters IV45~IV47 invert and delay an output signal from the NOR gate NOR5 to output the cell plate signal CPL.

Here, the power-up detecting signal PUP is to reset the register after data stored in the register are read in the initial reset mode.

If the input data DQi inputted through an input pad are toggled after the command signal 1st_CMD is activated to a high level, the write control signal ENW and the cell plate signal CPL having a pulse width for a delay time of the delay unit 54.

Figure 27:
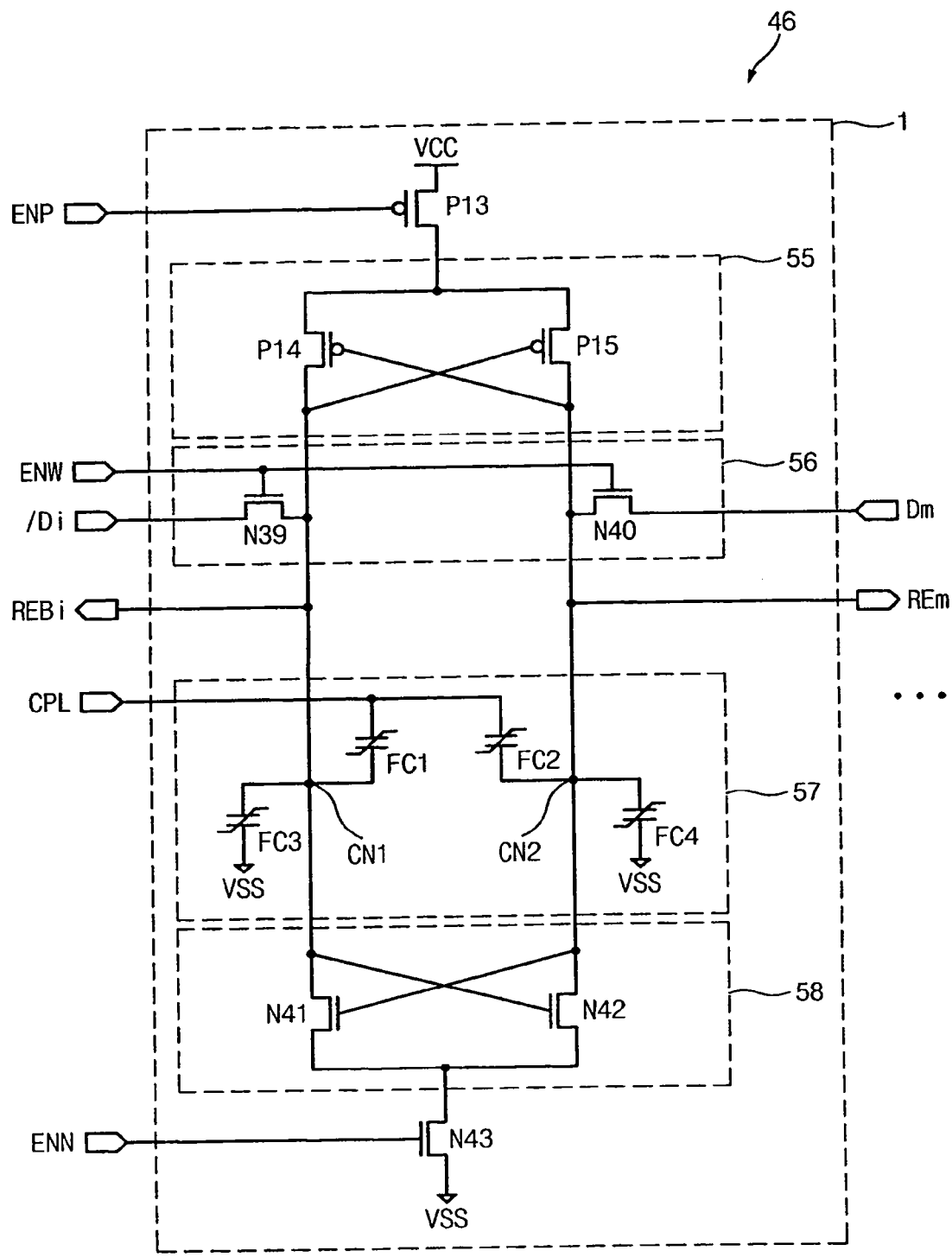
FIG. 27 is a circuit diagram illustrating a program register array of FIG. 22.

FIG. 27 is a circuit diagram illustrating the program register array 46 of FIG. 22.

The program register array 46 comprises m FeRAM registers 1.

The FeRAM register 1 comprises a pull-up switch P13, a pull-up driver 55, a write enable controller 56, a ferroelectric capacitor unit 57, a pull-down driver 58 and a pull-down switch N43.

The pull-up switch P13, connected between the power voltage terminal VCC and the pull-up driver 55, has a gate to receive the pull-up enable signal ENP. The pull-up driver 55, connected between the pull-up switch P13 and the write enable controller 56, comprises PMOS transistors P14 and P15 connected with a latch structure between nodes CN1 and CN2.

The write enable controller 56 comprises NMOS transistors N39 and N40. The NMOS transistors N39, connected between a data input terminal /Di and the node CN1, has a gate to receive the write control signal ENW, and the NMOS transistor N40, connected between a data input terminal Di and the node CN2, has a gate to receive the write control signal ENW.

The ferroelectric capacitor unit 57 comprises nonvolatile ferroelectric capacitors FC1~FC4. The nonvolatile ferroelectric capacitor FC1 has one terminal connected to the node CN1 and the other terminal to receive the cell plate signal CPL. The nonvolatile ferroelectric capacitor FC2 has one terminal connected to the node CN2 and the other terminal to receive the cell plate signal CPL. The nonvolatile ferroelectric capacitor FC3 is connected between the node CN1 and the ground voltage terminal, and the nonvolatile ferroelectric capacitor FC4 is connected between the node CN2 and the ground voltage terminal. Here, the nonvolatile ferroelectric capacitors FC3 and FC4 may be selectively added depending on loading level of the nodes CN1 and CN2.

The pull-down driver 58, connected between the ferroelectric capacitor unit 57 and the pull-down switch N43, comprises NMOS transistors N41 and N42 connected with a latch structure between the nodes CN1 and CN2. The pull-down switch N43, connected between the pull-down driver 58 and the ground voltage VSS terminal, has a gate to receive the pull-down enable signal ENN. The program register array 46 outputs control signals REBi and REi through an output terminal.

Figure 28:
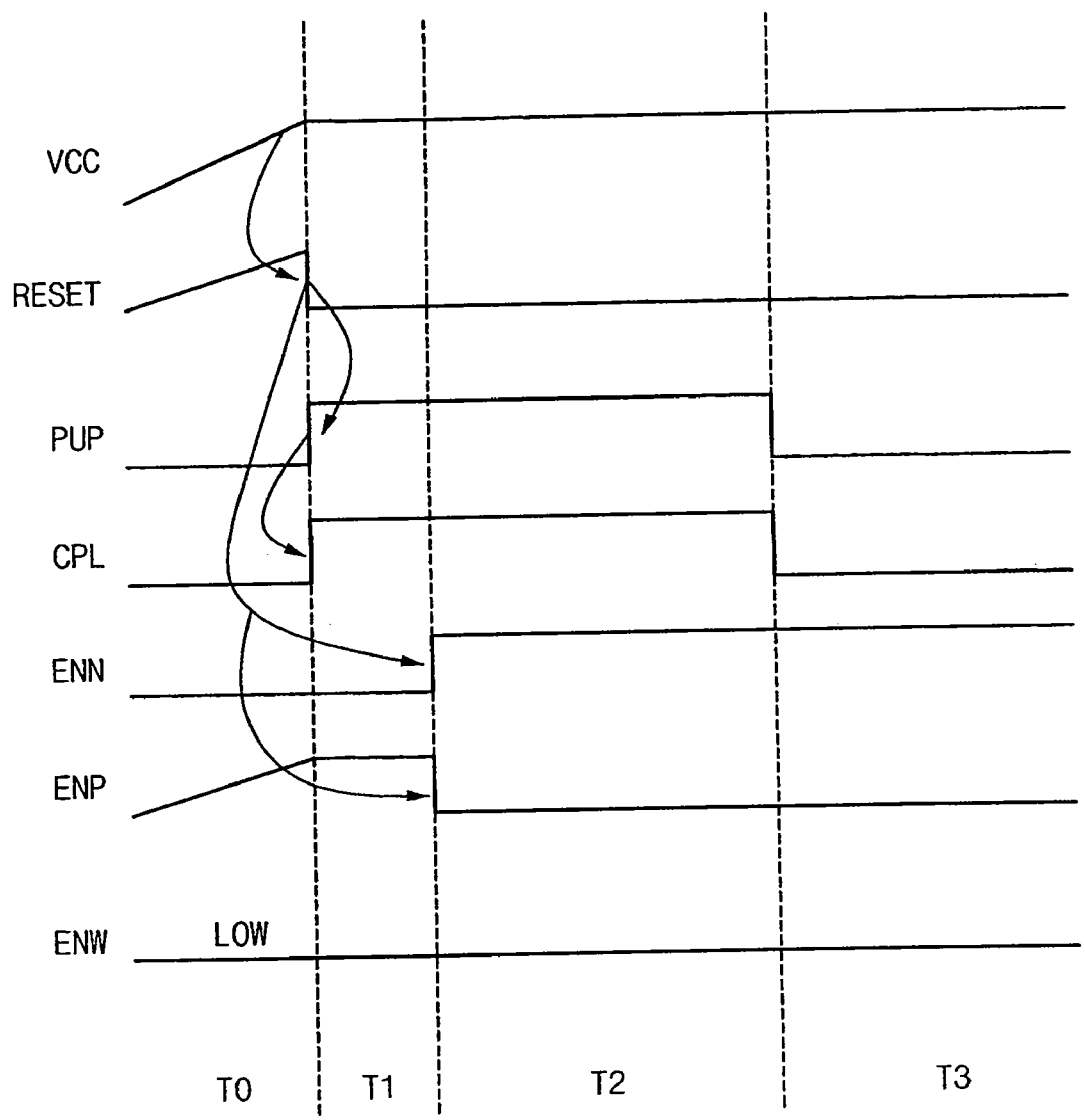
FIG. 28 is a timing diagram illustrating the operation of the FeRAM register array of FIG. 27 in a power-up mode.

FIG. 28 is a timing diagram illustrating the operation of the FeRAM register array 46 of FIG. 27 in a power-up mode.

In an interval T1 after the power-up mode, when power voltage VCC reaches a stabilized voltage level, the reset signal RESET becomes at a low level and the power-up detecting signal PUP is at a high level.

Then, the cell plate signal CPL transits to a high level as the power-up detecting signal PUP is at a high level. Here, charges stored in the nonvolatile ferroelectric capacitors FC1 and FC2 of the program register array 46 generate a voltage difference between the nodes CN1 and CN2 by capacitance load of the nonvolatile ferroelectric capacitors FC3 and FC4.

In an interval T2, since the sufficient voltage difference between the nodes CN1 and CN2 is generated, the pull-down enable signal ENN is enabled to a high level, and the pull-up enable signal ENP is disabled to a low level. As a result, data of the nodes CN1 and CN2 are amplified.

Thereafter, in an interval T3, when data amplification of nodes CN1 and CN2 is completed, the power-up detecting signal PUP and the cell plate signal CPL transits to the low level again. As a result, the destroyed high data of the nonvolatile ferroelectric capacitor FC1 or FC2 are restored. Here, the write control signal ENW is maintained at the low level to prevent external data from being re-written.

Figure 29:
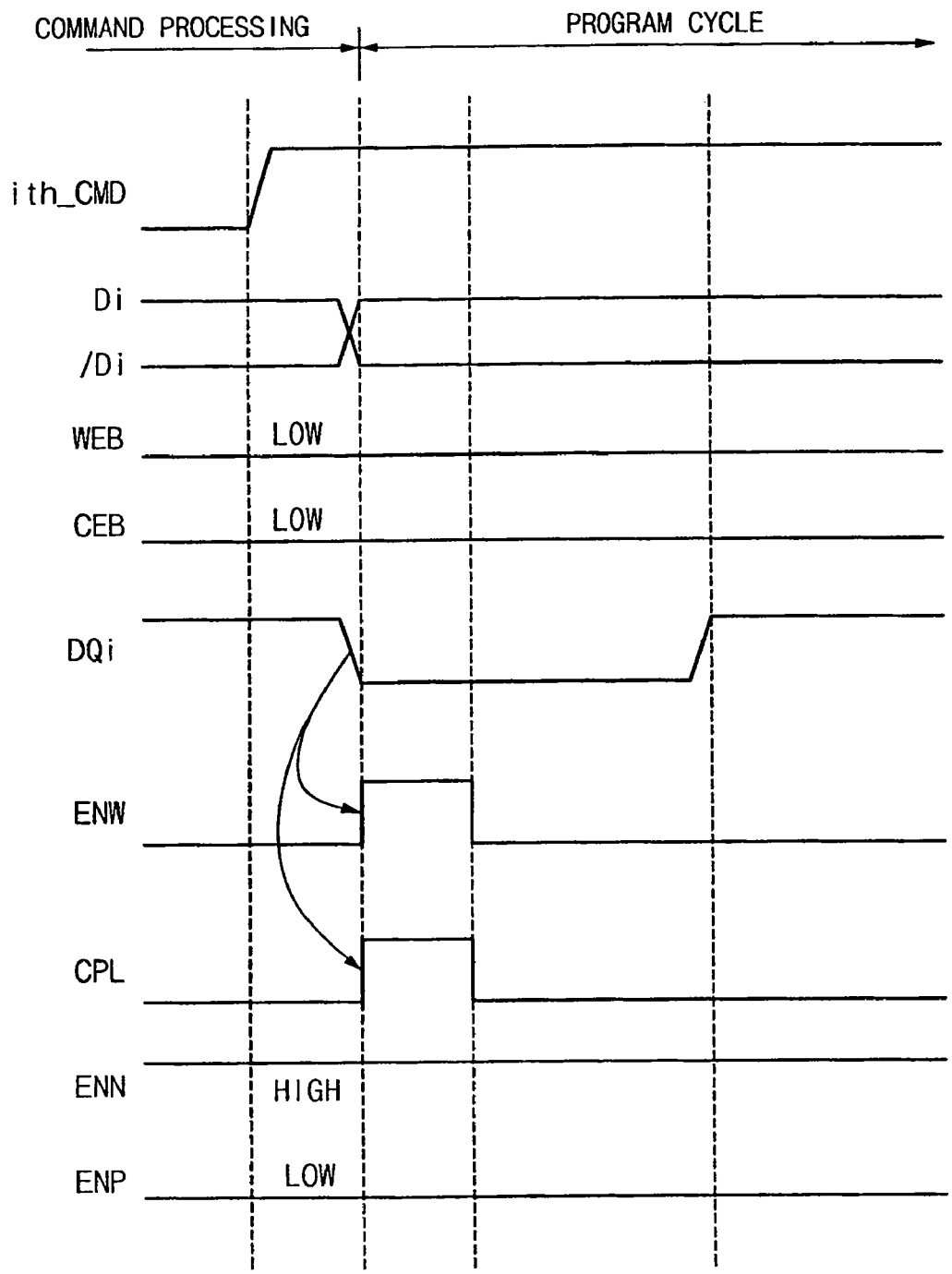
FIG. 29 is a timing diagram illustrating the operation of the FeRAM register array of FIG. 27.

FIG. 29 is a timing diagram illustrating the operation of the FeRAM register array 46 of FIG. 27.

When a predetermined time passes after the command signal 1st_CMD is activated to a high level, new data Di and /Di are inputted. When the input data DQi applied from the data input/output pad is disabled from a high to low level, the program cycle starts. As a result, the write control signal ENW to write new data in the register and the cell plate signal CPL transit to a high level. Here, the pull-down enable signal ENN is maintained at the high level, and the pull-up enable signal ENP is maintained at the low level.

If the command signal 1st_CMD having a high level is inputted into the program register controller 44, signal input from the program command processor 43 is prevented. As a result, the program operation can be performed while no more control command is inputted.

As described above, a nonvolatile programmable logic circuit using a ferroelectric memory according to an embodiment of the present invention disconnects power supply during a stand-by mode of the system, thereby reduce power consumption. A nonvolatile register is used by program commands to change the configuration of circuits and parameters, which results in small quantity batch production with a mask set. Also, a nonvolatile ferroelectric memory is applied to a FPGA (Field Programmable Gate Array), thereby preventing leakage of internal data and reducing the area of a chip. Additionally, since a nonvolatile memory function and an operation function are performed with a nonvolatile ferroelectric memory, extra external memory devices are unnecessary.

The invention claimed is:

1. A nonvolatile programmable logic circuit comprising:
   a flip-flop for selectively storing input data in response to a clock signal;
   a first nonvolatile ferroelectric register for generating a first logic control signal to selectively transmit the clock signal depending on a programmed code in a nonvolatile ferroelectric capacitor; and
   a second nonvolatile ferroelectric register for generating a second logic control signal to reset the flip-flop depending on a programmed code in a nonvolatile ferroelectric capacitor.

2. The circuit according to claim 1, wherein the second nonvolatile ferroelectric register stores data outputted from the flip-flop.

3. The circuit according to claim 1, further comprising a logic combination means for combining the input data.

* * * * *